United States Patent
Sasaki et al.

(10) Patent No.: US 10,592,030 B2
(45) Date of Patent: Mar. 17, 2020

(54) DISPLAY DEVICE

(71) Applicant: Japan Display Inc., Tokyo (JP)

(72) Inventors: Tohru Sasaki, Tokyo (JP); Hajime Akimoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/995,274

(22) Filed: Jun. 1, 2018

(65) Prior Publication Data

US 2018/0356927 A1 Dec. 13, 2018

(30) Foreign Application Priority Data

Jun. 8, 2017 (JP) ................................ 2017-113243

(51) Int. Cl.
| | |
|---|---|
| *G06F 3/041* | (2006.01) |
| *G06F 3/044* | (2006.01) |
| *H01L 27/32* | (2006.01) |

(52) U.S. Cl.
CPC ............ *G06F 3/0412* (2013.01); *G06F 3/044* (2013.01); *G06F 3/0416* (2013.01); *H01L 27/323* (2013.01); *H01L 27/3276* (2013.01); *G06F 2203/04111* (2013.01); *G06F 2203/04112* (2013.01)

(58) Field of Classification Search
CPC .. G06F 2203/04111; G06F 2203/04112; G06F 3/0412; G06F 3/0416; G06F 3/044; G06F 3/0213; H01L 27/323; H01L 27/3276
See application file for complete search history.

(56) References Cited

U.S. PATENT DOCUMENTS

| | | | | |
|---|---|---|---|---|
| 2002/0030666 A1* | 3/2002 | Philipp | ................ | G06F 3/0213 345/168 |
| 2009/0002337 A1* | 1/2009 | Chang | .................... | G06F 3/044 345/174 |
| 2010/0013745 A1* | 1/2010 | Kim | ....................... | G06F 3/0412 345/76 |
| 2010/0090979 A1* | 4/2010 | Bae | ....................... | G06F 3/0416 345/174 |
| 2010/0271330 A1 | 10/2010 | Philipp | | |
| 2011/0210936 A1* | 9/2011 | Wang | ..................... | G06F 3/044 345/174 |
| 2012/0062515 A1* | 3/2012 | Teng | ....................... | G06F 3/044 345/174 |

(Continued)

FOREIGN PATENT DOCUMENTS

JP 2007-299409 A 11/2007

*Primary Examiner* — Richard J Hong
(74) *Attorney, Agent, or Firm* — Michael Best & Friedrich LLP

(57) ABSTRACT

Provided is a display device including a plurality of pixels and a touch sensor overlapping with the plurality of pixels, the touch sensor. The touch sensor possesses: a first wiring arranged in a first direction and including a plurality of first electrodes; and a second wiring arranged in a second direction intersecting the first direction and including a plurality of second electrodes. Each of the first electrodes and each of the second electrodes vary in width continuously or stepwise in the first direction and the second direction, respectively, and satisfy a certain relationship with respect to an area and a total length of sides thereof.

17 Claims, 26 Drawing Sheets

(56) References Cited

U.S. PATENT DOCUMENTS

2013/0181943 A1\* 7/2013 Bulea ..................... G06F 3/044
　　　　　　　　　　　　　　　　　　　　　345/174
2016/0328061 A1\* 11/2016 Chiang ................ G06F 3/0412
2017/0269780 A1\* 9/2017 Zhang ................. G06F 3/0418

\* cited by examiner

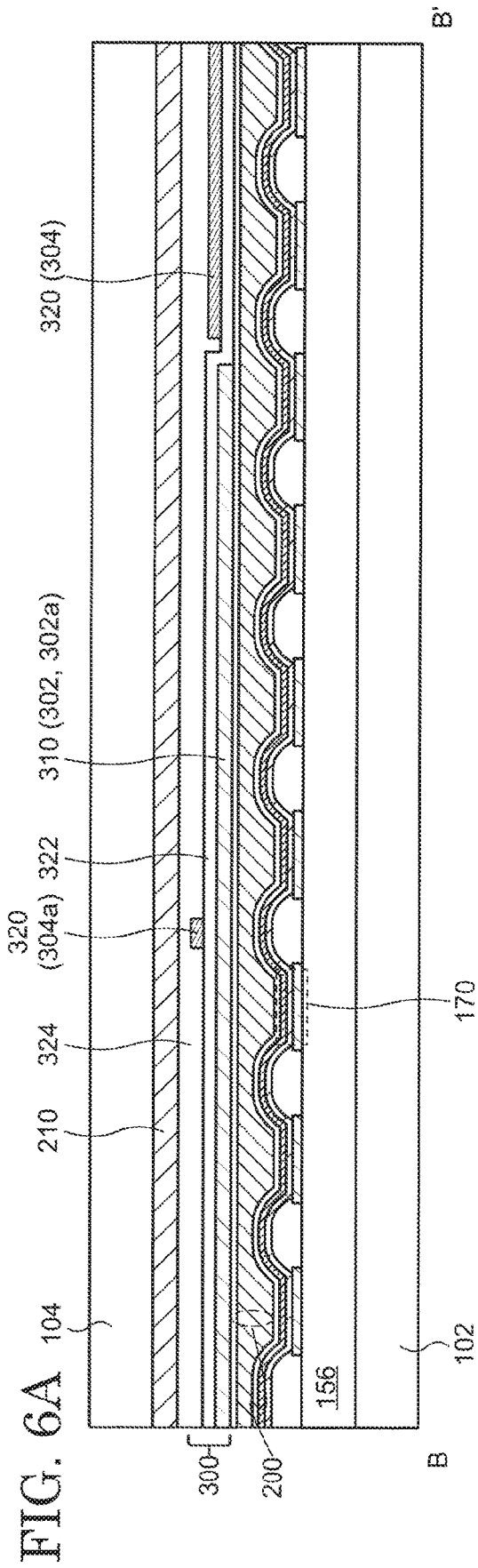
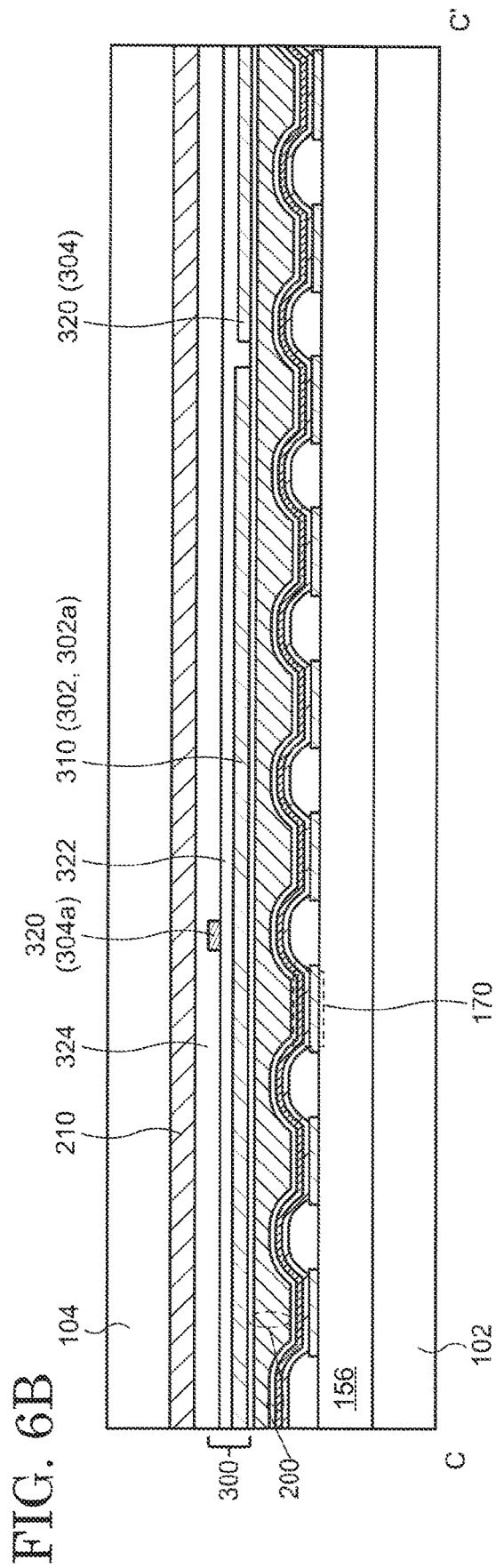

DISPLAY DEVICE

CROSS REFERENCE TO RELATED APPLICATIONS

This application is based on and claims the benefit of priority from the prior Japanese Patent Application No. 2017-113243, filed on Jun. 8, 2017, the entire contents of which are incorporated herein by reference.

FIELD

An embodiment of the present invention relates to a display device on which a touch sensor is mounted. For example, an embodiment of the present invention relates to an organic EL (Electroluminescence) display device on which a touch sensor is mounted.

BACKGROUND

A touch sensor has been known as an interface for a user to input information to a display device. Arrangement of a touch sensor so as to overlap with a screen of a display device allows a user to input information and operate input buttons and icons displayed on the screen by directly or indirectly contacting the screen with a finger (a touch). For example, Japanese Patent Application Publication No. 2007-299409 discloses a touch sensor structured by a triangle electrode and a rectangular electrode arranged so as to cross a screen. In this touch sensor, one of the coordinates of a touch position is determined by using a gradient of an electric field generated by the triangle electrode.

SUMMARY

An embodiment of the present invention is a display device including a plurality of pixels and a touch sensor overlapping with the plurality of pixels. The touch sensor possesses: a first wiring arranged in a first direction and including a plurality of first electrodes; and a second wiring arranged in a second direction intersecting the first direction and including a plurality of second electrodes. Each of the first electrodes and each of the second electrodes vary in width continuously or stepwise in the first direction and the second direction, respectively, and satisfy the following equation:

$$0.042A \leq \frac{S}{A} < 0.063A$$

where S is an area of each of the first electrodes or each of the second electrodes, and A is a total length of sides of each of the first electrodes or each of the second electrodes.

An embodiment of the present invention is a display device including a plurality of pixels each having a light-emitting element and a touch sensor overlapping with the plurality of pixels. The touch sensor possesses: first to nth transmitting wirings arranged in a stripe form and each including a plurality of alternating transmitting electrodes and connection portions; and first to mth receiving wirings arranged in a stripe form and each including a plurality of alternating receiving electrodes and connection portions. Each of the plurality of transmitting electrodes and the plurality of receiving electrodes has a triangle shape, and m and n are each a natural number equal to or larger than 2.

An embodiment of the present invention is a display device including a plurality of pixels and a touch sensor overlapping with the plurality of pixels. The touch sensor possesses: a first wiring, a second wiring, and a third wiring each arranged in a stripe form and extending in a first direction; and a fourth wiring and a fifth wiring each arranged in a stripe form and extending in a second direction intersecting the first direction. Each of the first wiring, the second wiring, and the third wiring is connected to a plurality of first electrodes. Each of the fourth wiring and the fifth wiring is connected to a plurality of second electrodes. One of the second electrodes of the fourth wiring is surrounded by one of the plurality of first electrodes of the first wiring, one of the plurality of first electrodes of the second wiring, and one of the plurality of first electrodes of the third wiring. One of the second electrodes of the fifth wiring is surrounded by one of the plurality of first electrodes of the first wiring, one of the plurality of first electrodes of the second wiring, and one of the plurality of first electrodes of the third wiring.

An embodiment of the present invention is a display device including a plurality of pixels and a touch sensor overlapping with the plurality of pixels. The touch sensor possesses: a plurality of transmitting wirings arranged in a stripe form and each connected to a plurality of transmitting electrodes; and a plurality of receiving wirings arranged in a stripe form and each connected to a plurality of receiving electrodes. The receiving electrodes sandwiched by two adjacent transmitting wirings are fewer than the transmitting electrodes sandwiched by two adjacent transmitting wirings.

An embodiment of the present invention is a display device including a plurality of pixels and a touch sensor overlapping with the plurality of pixels. The touch sensor possesses: a plurality of alternating first wirings and second wirings; and a plurality of third wirings intersecting the plurality of first wirings and the plurality of second wirings. Each of the plurality of first wirings has a plurality of quadrangle transmitting electrodes, each of the plurality of second wirings has a plurality of octagonal transmitting electrodes, and each of the third wirings has a plurality of octagonal transmitting electrodes.

BRIEF DESCRIPTION OF DRAWINGS

FIG. 6A and FIG. 6B are schematic cross-sectional views of a display device according to an embodiment of the present invention;

DESCRIPTION OF EMBODIMENTS

Hereinafter, the embodiments of the present invention are explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the present specification and claims, when a plurality of films is formed by processing one film, the plurality of films may have functions or rules different from each other. However, the plurality of films originates from a film formed as the same layer in the same process and has the same layer structure and the same material. Therefore, the plurality of films is defined as films existing in the same layer.

In the specification and the claims, unless specifically stated, when a state is expressed where a structure is arranged "on", "above" or "over" another structure, such an expression includes both a case where the substrate is arranged immediately above the "other structure" so as to be in contact with the "other structure" and a case where the structure is arranged over the "other structure" with an additional structure therebetween.

First Embodiment

1. Outline Structure

Figure 1:
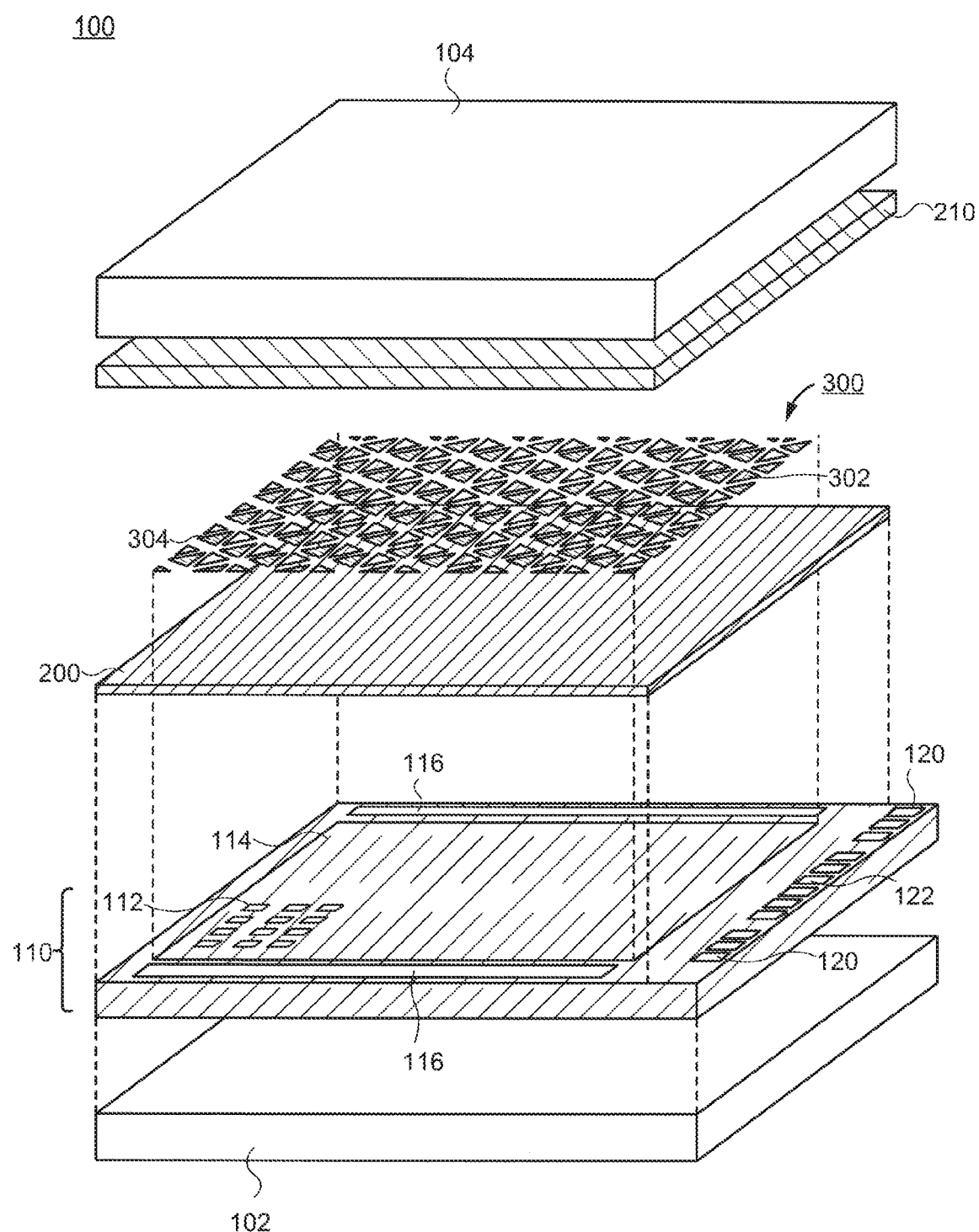
FIG. 1 is a schematic developed view of a display device according to an embodiment of the present invention.

FIG. 1 is a schematic developed view of a display device on which a touch sensor is mounted (hereinafter, simply referred to as a display device) 100 which is an embodiment of the present invention. The display device 100 has a substrate 102, a circuit layer 110, a protection film (hereinafter, referred to as a passivation film) 200 over the circuit layer 110, and a touch sensor 300. The display device 100 may further possess a polarizing plate 210 and an opposing substrate 104 as an optional structure.

The substrate 102 has a function to support the circuit layer 110, the passivation film 200, and the touch sensor 300 and may include glass, quartz, a polymer, or the like.

The circuit layer 110 is provided to give a display function to the display device 100 and is structured with a stack of a variety of patterned insulating films, semiconductor films, and conductive films. Appropriate arrangement of these films allows the formation of a plurality of pixels 112, scanning-line driver circuits 116, terminals 120 and 122, and the like in the circuit layer 110. A display region 114 is formed by the plurality of pixels 112.

The passivation film 200 is provided to protect a display element disposed in each pixel 112 and is formed with a single insulating film or a plurality of insulating films. The touch sensor 300 is arranged to overlap with the display region 114 with the passivation film 200 sandwiched therebetween.

As described below, the touch sensor 300 possesses a plurality of first electrodes 302 and a plurality of second electrodes 304. One of the first electrode 302 and the second electrode 304 is also called a transmitting electrode (Tx), the other is called a receiving electrode (Rx), and the first electrode 302 and the second electrode 304 are collectively called touch electrodes. As described below in detail, the first electrodes 302 and the second electrode 304 are spaced from each other, and capacitance is formed therebetween. When a finger of a person or the like touches the display region 114 through the first electrode 302 and the second electrode 304 (hereinafter, referred to as a touch), a potential of one of these electrodes varies due to capacitive coupling, and a touch position is determined by reading out this variation. Thus, a so-called projective-type touch sensor with an electrostatic capacity mode is formed with the first electrodes 302 and the second electrodes 304. Hereinafter, details of each structure are described.

2. Circuit Layer 110

Figure 2:
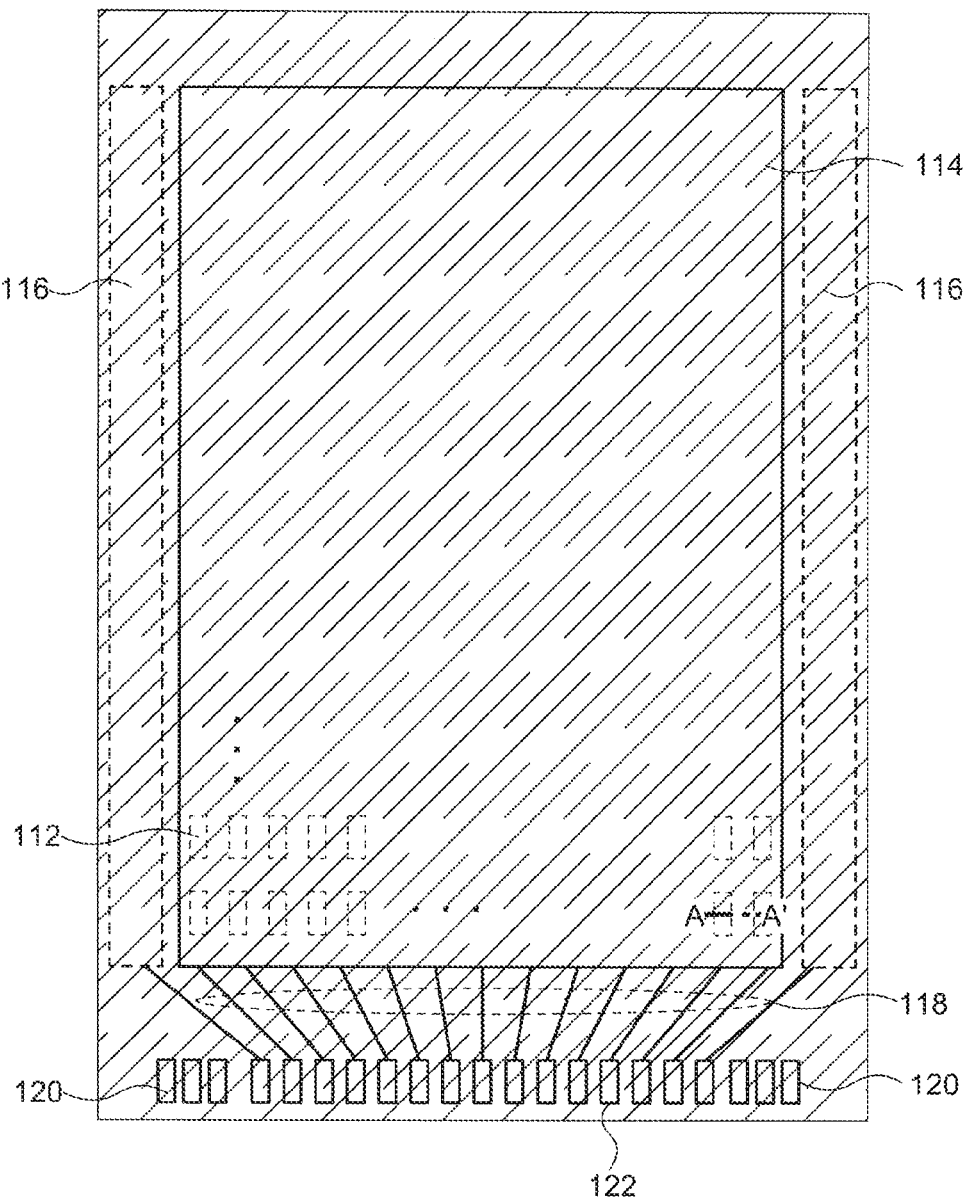
FIG. 2 is a schematic top view of a display device according to an embodiment of the present invention.

FIG. 2 shows a schematic top view of the circuit layer 110. As described above, the circuit layer 110 has the plurality of pixels 112 each having the display element, and the display region 114 is structured by the plurality of pixels 112. A plurality of semiconductor elements such as a transistor and a capacitor element for controlling the display element is disposed in each pixel 112 in addition to the display element such as a light-emitting element and a liquid crystal element. The color provided by each pixel 112 is determined by the display element or the properties of a color filter arranged over the pixels 112 as an optional structure. The scanning-line driver circuits 116 for controlling operation of the pixels 112 are formed outside the display region 114. Two scanning-line driver circuits 116 are arranged so as to sandwich the display region 114 in FIG. 2. However, the number of the scanning-line driver circuits 116 may be one. Wirings 118 extend from the display region 114 and the scanning-line driver circuits 116 to a side surface of the substrate 102 and are exposed between an edge portion of the substrate 102 and the display region 114 (frame) to form terminals 122. A connector 126 such as a flexible printed circuit (FPC) substrate is connected to the terminals 122, and a variety of signals for controlling the scanning-line driver circuits 116 and the pixels 112 is supplied through the connector 126. Although not illustrated in FIG. 2, an integrated circuit 128 formed over a semiconductor substrate may be disposed as a signal-line side driver circuit over the substrate 102 or the connector 126 (see FIG. 4).

Figure 3:
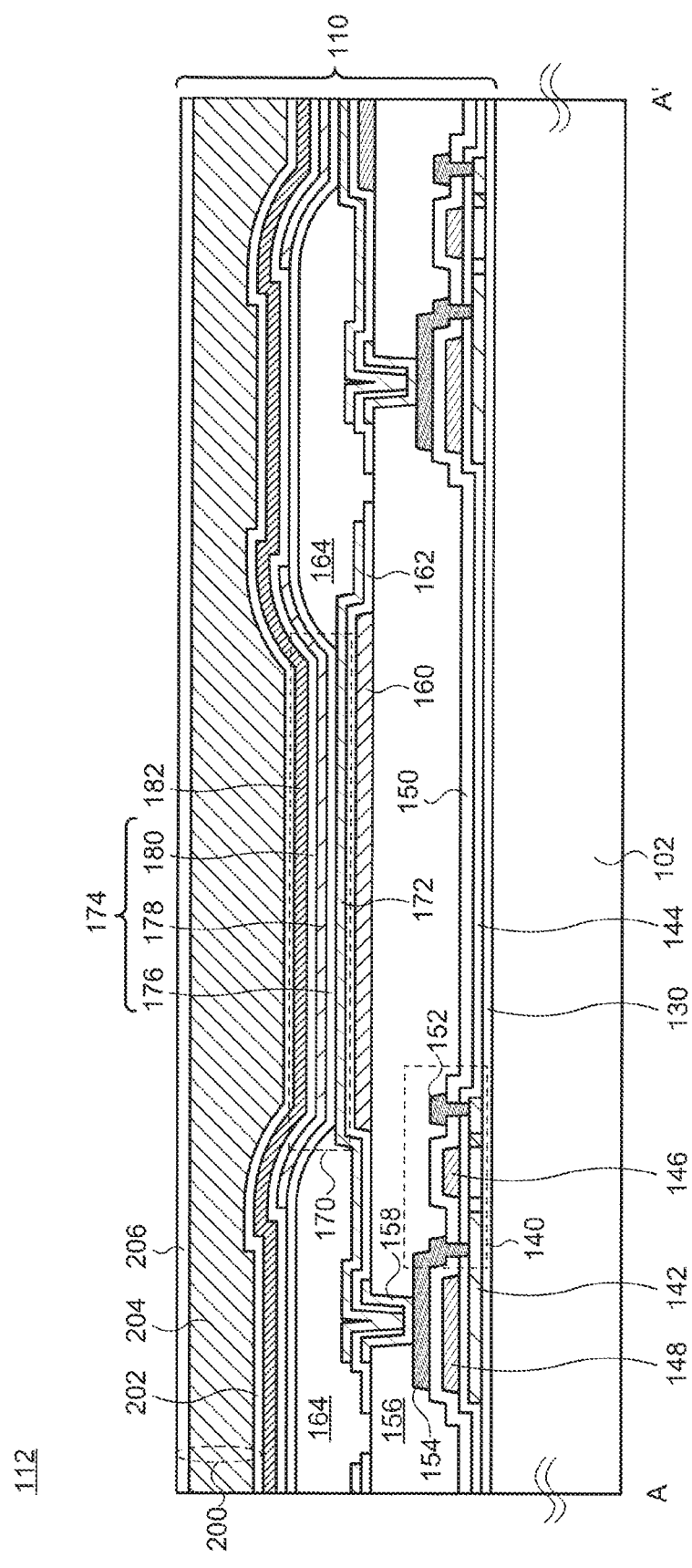
FIG. 3 is a schematic cross-sectional view of a display device according to an embodiment of the present invention.

A schematic cross-sectional view along a chain line A-A' in FIG. 2 is shown in FIG. 3. In this cross-sectional view, the touch sensor 300 is not illustrated. Here, an example is shown in which a light-emitting element 170 is disposed in each pixel 112 as an example of the display element, and the light-emitting element 170 as well as semiconductor elements such as a transistor 140 for driving the light-emitting element 170 is illustrated in FIG. 3. More specifically, each pixel 112 has the transistor 140 over the substrate 102 through an undercoat 130 provided so as to be in contact with the substrate 102. The transistor 140 possesses a semiconductor film 142, and a gate electrode 146 over the semiconductor film 142 with a gate insulating film 144 therebetween. The transistor 140 further includes an interlayer film 150 disposed to cover the gate electrode 146 and source/drain electrodes 152 and 154 formed thereover. The source/drain electrodes 152 and 154 are electrically connected to the semiconductor film 142 in openings formed in the gate insulating film 144 and the interlayer film 150.

Each pixel 112 further has a capacitor electrode 148 existing in the same layer as the gate electrode 146, and the capacitor electrode 148 overlaps with a part of the semiconductor film 142 with the gate insulating film 144 sandwiched therebetween. A part of the source/drain electrode 154 overlaps with the capacitor electrode 148 through the interlayer film 150, and a storage capacitor is formed by the part of the semiconductor film 142, the gate insulating film 144, the capacitor electrode 148, the interlayer film 150, and the part of the source/drain electrode 154 overlapping with one another.

A leveling film 156 is disposed over the transistor 140 and the storage capacitor, and a connection electrode 158 is electrically connected to the source/drain electrode 154 in a contact hole formed in the leveling film 156. The connection electrode 158 is further electrically connected to a pixel electrode 172 of the light-emitting element 170, by which the transistor 140 and the light-emitting element 170 are electrically connected to each other. A partition wall 164 covering an edge portion of the pixel electrode 172 is formed over the leveling film 156, by which depressions and projections caused by the contact hole and the pixel electrode 172 are absorbed.

The light-emitting element 170 is structured by the pixel electrode 172, an electroluminescence layer (hereinafter, referred to as an EL layer) 174 over the pixel electrode 172, and an opposing electrode 182. The EL layer 174 is composed of a single layer or a plurality of layers as shown in FIG. 3. The EL layer 174 may be formed with layers having a variety of functions, such as a carrier-injection layer, a carrier-transporting layer, an emission layer, and a carrier-blocking layer. In FIG. 3, an example is shown in which the EL layer 174 including a hole-injection/transporting layer 176, an emission layer 178, and an electron-injection/transporting layer 180 is provided over the partition wall 164 and the pixel electrode 172. The opposing electrode 182 is formed over the plurality of pixels 112 to cover the whole of the display region 114.

Each pixel 112 may possess, as an optional structure, a supplementary capacitor electrode 160 and an insulating film 162 covering the supplementary capacitor electrode 160. The supplementary capacitor electrode 160 may be formed to overlap with the pixel electrode 172 to form a supplementary capacitor in association with the insulating film 162 formed therebetween. The supplementary capacitor is connected to the source/drain electrode 154 through a wiring which is not illustrated and contributes to stabilization of a potential between the gate electrode 146 and the source/drain electrode 154. Note that the insulating film 162 may have an opening which allows contact between the leveling film 156 and the partition wall 164. It is possible to release impurities included in the leveling film 156 through this opening during the formation process of the partition wall 164, thereby increasing reliability of the semiconductor elements including the transistor 140.

In the present specification and claims, the circuit layer 110 is defined as a structure including the layers from the undercoat 130 to the opposing electrode 182. Note that the aforementioned structure of the pixel 112 is merely an example, and the structure, the number, and the connection relationship of the semiconductor elements included in the pixel 112 are not limited.

3. Passivation Film

As described above, the passivation film 200 is provided to protect the display elements and may include a single insulating film or a plurality of insulating films. An example is demonstrated in FIG. 3 in which the passivation film 200 has a first layer 202, a second layer 204, and a third layer 206. In this case, the first layer 202 and the third layer 206 may include an inorganic compound containing silicon, such as silicon oxide, silicon nitride, silicon oxynitride, and silicon nitride oxide. The second layer 204 may include a polymer such as an epoxy resin, an acrylic resin, and a silicon resin, by which depressions and projections caused by the partition wall 164 are absorbed and a flat surface is provided over the pixels 112. Formation of a flat surface prevents generation of a pinhole in the third layer 206 or damage of the third layer 206.

4. Touch Sensor

Figure 4:
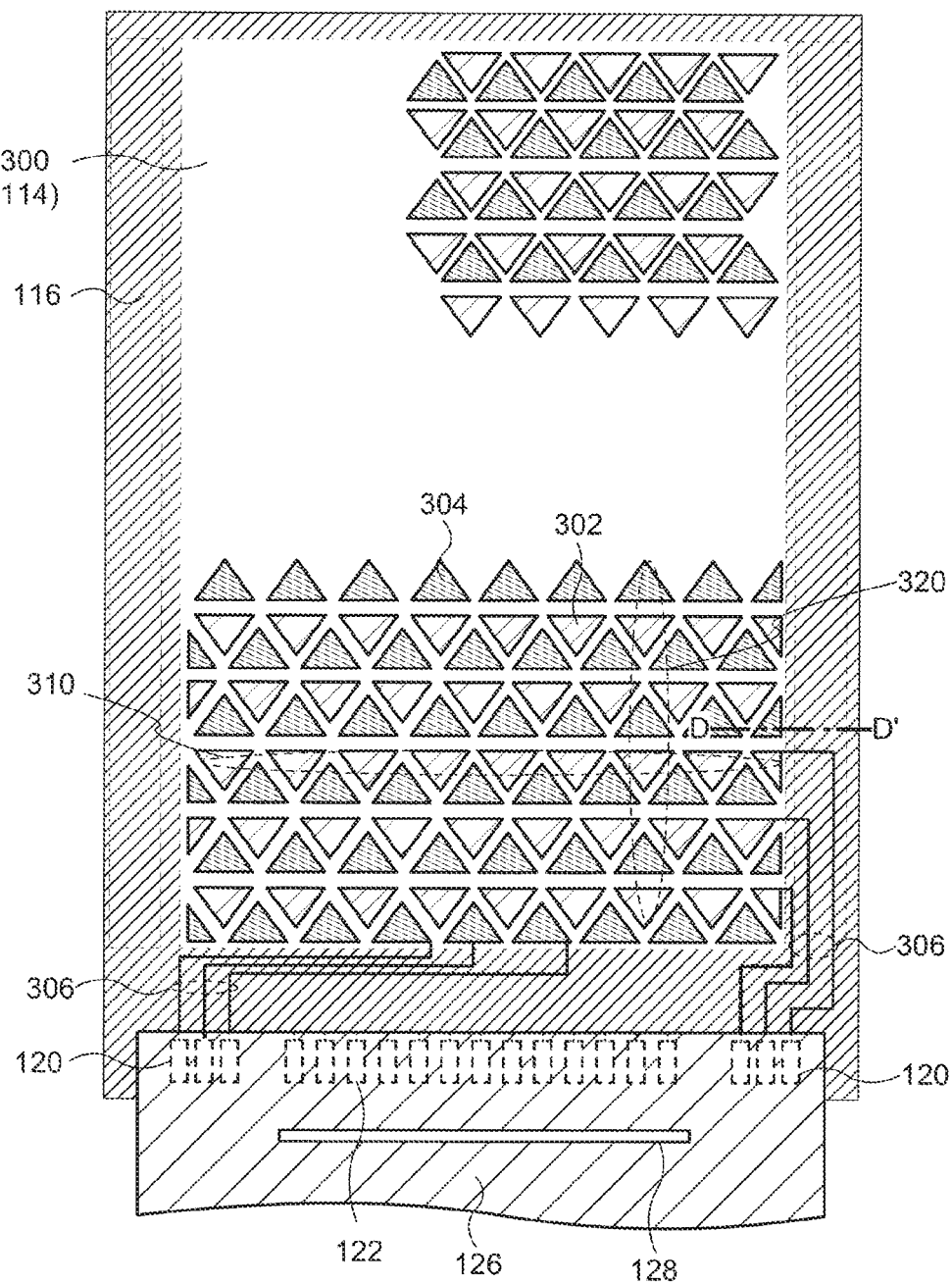
FIG. 4 is a schematic top view of a display device according to an embodiment of the present invention.
Figure 5:
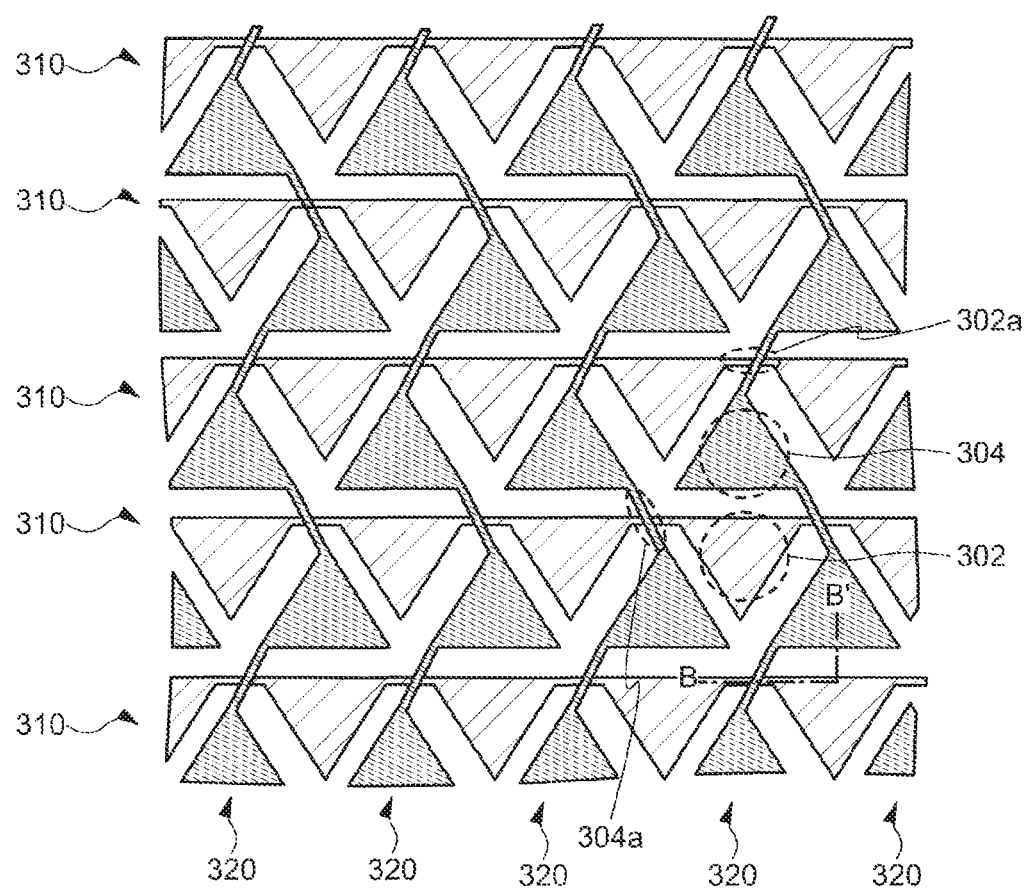
FIG. 5 is a schematic top view of touch electrodes of a display device according to an embodiment of the present invention.

A schematic top view of the display device 100 in a state where the touch sensor 300 is mounted is shown in FIG. 4, and an enlarged view of the touch sensor 300 is shown in FIG. 5. As shown in FIG. 4, the touch sensor 300 has substantially the same shape and size as those of the display region 114 and overlaps with the display region 114.

4.1 Touch Electrode

As shown in FIG. 4 and FIG. 5, the plurality of first electrodes 302 forms a plurality of rows in a direction parallel to a short side of the substrate 102. In each row, the plurality of first electrodes 302 is linearly arranged, and two adjacent first electrodes 302 are electrically connected to each other with a connection portion 302a to give a wiring (first wiring) 310. In other words, the first wirings 310 each have a plurality of alternating first electrodes 302 and connection portions 302a, and the touch sensor 300 includes the plurality of first wirings 310 (first to nth transmitting wirings. n is a natural number equal to or larger than 2) arranged in a stripe form and extending in the row direction (first direction). The first electrodes 302 are shifted by a half pitch in the row direction between the adjacent first wirings 310. Therefore, the first electrodes 302 overlap with the connection portions 302a in a direction (second direction) intersecting the row direction.

On the other hand, the second electrodes 304 form columns having a zig-zag pattern along a direction parallel to the long side of the substrate 102. In each column, two adjacent second electrodes 304 are electrically connected to each other with a connection portion 304a to give a wiring (second wiring) 320. In other words, the second wirings 320 each have a plurality of alternating second electrodes 304 and the connection portions 304a, and the touch sensor 300 includes the plurality of second wirings 320 (first to m th receiving wirings. m is a natural number equal to or larger than 2) arranged in a stripe form and extending in a column direction. The adjacent second electrodes 304 in the same second wiring 320 are shifted by a half pitch in the row direction and arranged in a zig-zag pattern. Therefore, the second electrodes 304 overlap with the connection portion 304a in the column direction, and the connection portions 304a incline from the direction in which the second wirings 320 extend. In contrast, the connection portions 302a of the first wirings 310 may be arranged substantially parallel to the direction in which the first wirings 310 extend.

Here, when the first electrodes 302 and the connection portions 302a are simultaneously formed, the connection portions 302a can be defined as regions having a constant width, and the first electrodes 302 can be defined as regions sandwiched by the adjacent connection portions 302a. The first electrodes 302 are regions in which a width continuously varies in the row direction and the column direction. Similarly, when the second electrodes 304 and the connection portions 304a are simultaneously formed, the connection portions 304a are regions having a constant width, and the second electrodes 304 are regions sandwiched by the adjacent connection portions 304a. The second electrodes 304 are regions in which a width continuously varies in the row direction and the column direction.

The first wirings 310 and the second wirings 320 are spaced from and electrically independent from each other. Therefore, one of the set of the first wirings 310 and the set of the second wirings 320 functions as driving wirings (transmitting wirings or driving wirings) of a projective-type touch sensor with an electrostatic capacity mode, while the other functions as detecting wirings (receiving wirings or detecting wirings). Any one of the set of the first wirings 310 and the set of the second wirings may function as the driving wirings. The embodiments described below are explained for a case where the first wirings 310 and the second wirings 320 respectively function as the driving wirings and the detecting wirings for convenience.

A schematic cross-sectional view along a chain line B-B' in FIG. 5 is shown in FIG. 6A. In FIG. 6A, the structure of the circuit layer 110 is simplified. As shown in FIG. 6A, the first wirings 310 are provided over the passivation film 200. The first wirings 310, that is, the first electrodes 302 and the connection portions 302a may be formed so as to be in contact with the passivation film 200. An interlayer insulating film 322 is formed over the first wirings 310, over which the second wirings 320 are formed.

As schematically shown in FIG. 6A, pitches of the first electrodes 302 and the second electrodes 304 are larger than a pitch of the pixels 112, and the plurality of pixels 112 are provided between two adjacent connection portions 302a or between two adjacent connection portions 304a. Therefore, the plurality of pixels 112 overlap with one of the first electrodes 302 or one of the second electrodes 304. In this case, the first electrodes 302 and the second electrodes 304 are configured to transmit visible light. For example, the first electrodes 302 and the second electrodes 304 are structured by using an oxide having conductivity, such as indium-tin oxide (ITO) or indium-zinc oxide (IZO), or a metal film having a thickness allowing visible light to pass therethrough.

The first electrodes 302 and the second electrodes 304 have a polygonal shape and may have a triangle or substantially triangle shape as shown in FIG. 4 and FIG. 5. In one first wiring 310, not only the terminal first electrodes 302 but also the first electrodes 302 sandwiched by the terminal first electrodes 302 have a polygonal shape such as a triangle. Similarly, in one second wiring 320, not only the terminal second electrodes 304 but also the second electrodes 304 sandwiched by the terminal second electrodes 304 have a polygonal shape such as a triangle. The triangle may be selected from an equilateral triangle, an isosceles triangle, a right-angled triangle, and a right-angled isosceles triangle. With respect to the plurality of second electrodes 304 adjacent to one first electrode 302 (alternatively, with respect to the plurality of first electrodes 302 adjacent to one second electrode 304) in a case of an equilateral triangle, an isosceles triangle, or a right-angled isosceles triangle in which two sides or three sides are the same in length, sensitivity of the first electrode 302 (alternatively, sensitivity of the second electrode 304) to the second electrodes 304 (alternatively, the first electrodes 302) are the same as each other, which enables a touch to be more correctly detected. When the first electrodes 302 and the second electrodes 304 are a triangle, the touch sensor 300 may be configured so that a direction of the first electrodes 304 is opposite to a direction of the second electrodes 304 in a plane parallel to the top surface thereof.

Note that, because the first electrodes 302 and the second electrodes 304 are prepared with photolithography, the corners of the first electrodes 302 and the second electrodes 304 are not ideal corners strictly but express curves in a plane parallel to the top surfaces of the first electrodes 302 and the second electrodes 304. However, in the embodiments of the present invention, such curves may not be considered unless the curves achieve a specific effect, and a touch sensor and a display device are included in the embodiments of the present invention in a case where the first electrodes 302 and the second electrodes 304 have curves at the corners thereof as long as the first electrodes 302 and the second electrodes 304 are substantially polygonal.

In the touch sensor 300, the first electrodes 310 serving as the driving wirings are provided with a pulse potential. Capacitive coupling between the first electrodes 302 and the second electrodes 304 caused during a touch results in a variation in potential of the detecting wirings (here, the second wirings 320). Detecting this variation allows the position (coordinates) of the touch to be determined. However, the opposing electrode 182 of the light-emitting element 170 is formed under the touch sensor 300 as shown in FIG. 6A, which also permits the first electrodes 302 and the second electrodes 304 to form capacitance (parasitic capacitance) with the opposing electrode 182. When the capacitance between the first electrodes 302 and the second electrodes 304 is not sufficiently large compared with the parasitic capacitance, the variation of the capacitance caused by a touch is insufficient, resulting in reduction of the sensitivity of the detection signal and a S/N ratio. In particular, when the parasitic capacitance between the detecting wirings (here, second wirings 320) and the opposing electrode 182 is increased, influence of the parasitic capacitance becomes prominent.

The parasitic capacitance between the opposing electrode 182 and the second electrode 304 is determined by the area of the second electrodes 304. This is because the opposing electrode 182 is formed so as to cover the whole of the display region 114, and the area of the opposing electrode 182 can be regarded as being substantially constant to the area of the second electrode 304. On the other hand, the capacitance between the first electrode 302 and the second electrode 304 is determined by lengths of sides opposing each other. Therefore, it is possible to increase sensitivity of the detection signal and a S/N ratio by reducing the area of the second electrode 304 with respect to the length of the sides of the first electrode 302 and the second electrode 304 opposing each other, by which high detection sensitivity and detection accuracy can be realized.

Figure 7A:
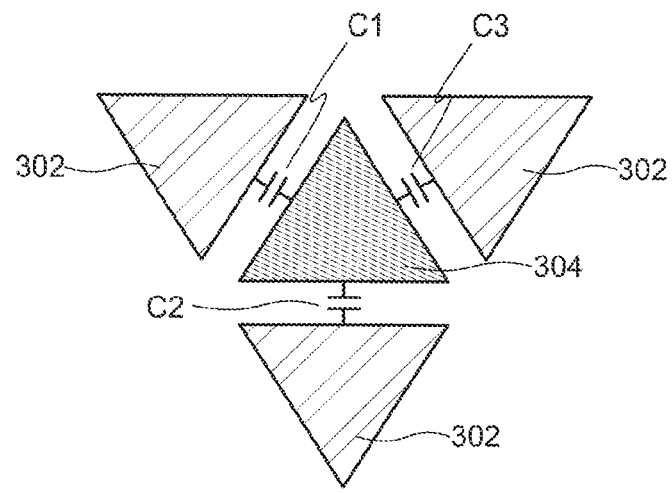
FIG. 7A and FIG. 7B are schematic top views of touch electrodes of a display device according to an embodiment of the present invention and a conventional display device, respectively.

In the touch sensor 300 having the shape shown in FIG. 4 and FIG. 5, one second electrode 304 is surrounded by three first electrodes 302 as shown in FIG. 7A. That is, one receiving electrode (second electrode 304) is surrounded by two adjacent transmitting electrodes of the kth (k is a natural number equal to or larger than 1 and smaller than n) transmitting wiring (second wiring 320) and the transmitting electrode of the (k+1)th transmitting wiring. Each side of the second electrode 304 is substantially parallel to and opposes a side of the adjacent first electrode 302. Hence, the second electrode 304 forms capacitances C1, C2, and C3 with the adjacent three first electrodes 302. Here, when the second electrode 304 is an equilateral triangle having a total length A of the sides, a total length of the sides of the second electrode 304 opposing the first electrodes 302 is A which is the same as the total length of the sides of one second electrode 304. Since the second electrode 304 is an equilateral triangle having a side of A/3 and a height of $3^{1/2} \times A/6$, its area S is expressed by the following equation (1).

$$S = \frac{1}{2} \times \frac{A}{3} \times \frac{\sqrt{3}}{6} A = 0.048 A^2 \tag{1}$$

Hence, a ratio of the area of the second electrode 304, which forms the capacitance with the first electrodes 302, with respect to the total length of the sides of the second electrode 304 opposing the first electrodes 302, that is, a ratio (=S/A) of the area S with respect to the total length A of the sides of the second electrode 304 is 0.048 A.

Figure 7B:
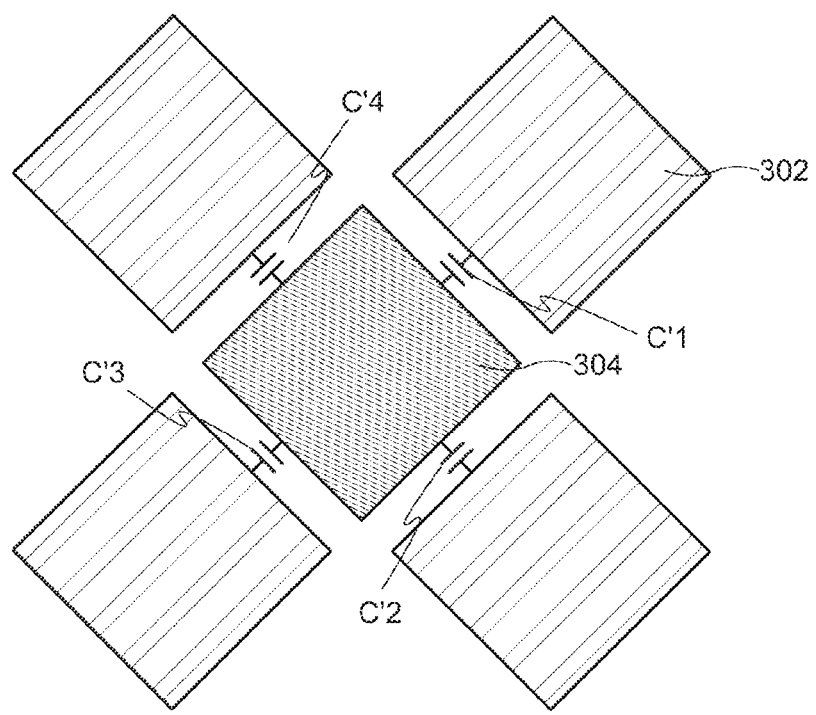

On the other hand, in the case of the diamond electrodes used for the driving wirings and the detecting wirings of a common touch sensor, one second electrode 304 is surrounded by four first electrodes 302 and forms capacitances C'1 to C'4 as shown in FIG. 7B. Therefore, when the total length of the sides of the second electrode 304 is A, a total length of the sides of the second electrode 304 opposing the first electrodes 302 is the same as the total length A of the sides of the second electrode 304. Since the second electrode 304 is a square having a side of A/4, its area S is $A^2/16$, and the ratio R is 0.063 A. Hence, it is possible to decrease the ratio R when the first electrodes 302 and the second electrodes 304 are shaped into a triangle, allowing the touch sensor 300 to exhibit high detection sensitivity and detection accuracy.

In the touch sensor 300 of the present embodiment, it is not always necessary that the ratio R of the area S with respect to the total length A of the sides of the second electrode 304 be 0.048 A, and the ratio R may be equal to or larger than 0.042 A and smaller than 0.063 A, equal to or larger than 0.042 A and smaller than 0.062 A, equal to or larger than 0.048 A and smaller than 0.063 A, or equal to or larger than 0.048 A and smaller than 0.062 A. In other words, the shape of each of the plurality of second electrodes 304 of the second wiring 320 or each of the second electrodes 304 connected to the second wiring 320 can be selected from arbitral polygonal shapes as long as any one of the following equations (2) to (5) is satisfied.

$$0.042 A \leq \frac{S}{A} < 0.063 A \tag{2}$$

$$0.042 A \leq \frac{S}{A} < 0.062 A \tag{3}$$

$$0.048 A \leq \frac{S}{A} < 0.063 A \tag{4}$$

$$0.048 A \leq \frac{S}{A} < 0.062 A \tag{5}$$

Note that these requirements can also be applied to the first electrodes 302.

In the example shown in FIG. 5 and FIG. 6A, the first wirings 310 and the second wirings 320 exist in different layers. In this case, it is preferred to configure the touch sensor 300 so that the first wirings 310 serving as the driving wirings are arranged closer to the circuit layer 110. This is because detection of the touch is carried out by sensing the variation of the potential of the second wirings 320 and the influence of the parasitic capacitance between the opposing electrode 182 and the second wirings 320 is larger than that between the opposing electrode 182 and the first wirings 310.

Figure 8:
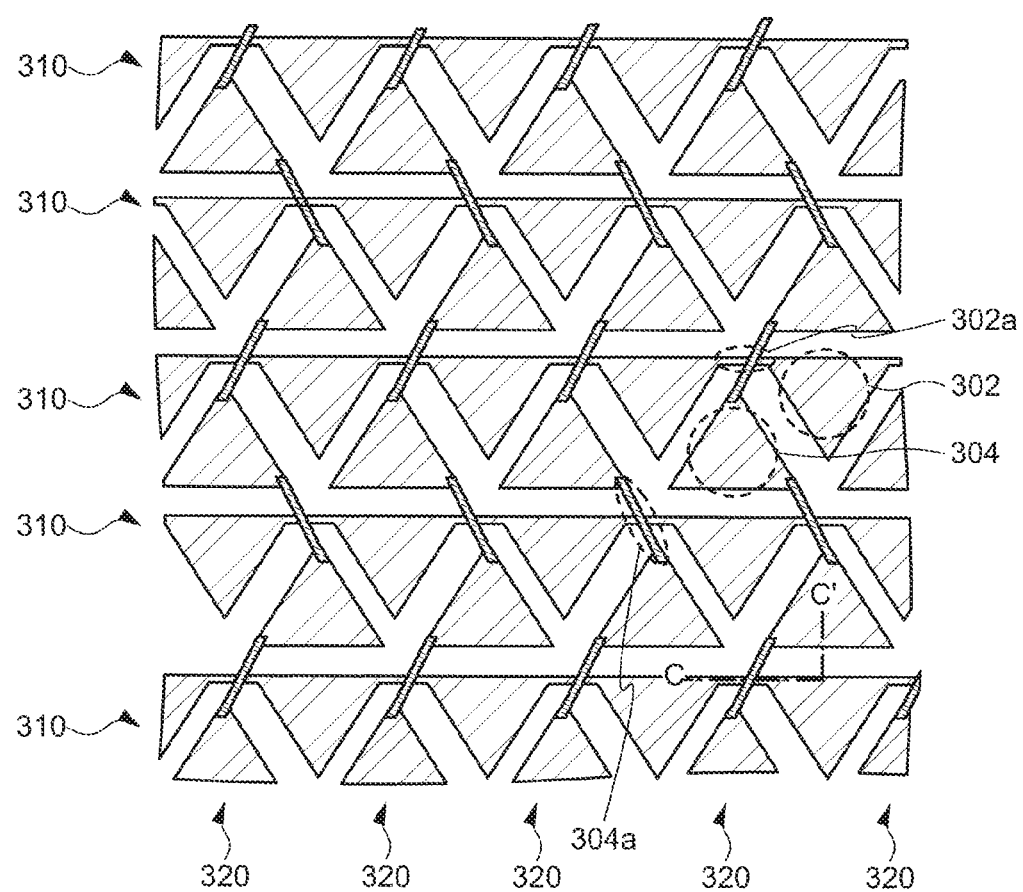
FIG. 8 is a schematic top view of touch electrodes of a display device according to an embodiment of the present invention.

The first wirings 310 and the second wirings 320 may exist in the same layer. For example, the first electrodes 302 and the second electrodes 304 are simultaneously formed to exist in the same layer as shown in FIG. 8. After that, the connection portions 304a are formed over the connection portions 302a with the interlayer insulating film 322 sandwiched therebetween so as to intersect the first wirings 310 in order to electrically connect the adjacent second electrodes 304. In this case, the first electrodes 302 and the second electrodes 304 may be formed so as to be in contact with the passivation film 200 as shown in a schematic cross-sectional view along a chain line C-C' (FIG. 6B). The connection portions 304a are formed over the interlayer insulating film 322 covering the first electrodes 302 and the second electrodes 304 and electrically connected to the second electrodes 304 through openings which are not illustrated. Although not illustrated, the structure of the touch sensor 300 is not limited thereto and may have a structure in which the connection portions 304a are arranged closer to the circuit layer 110, the interlayer insulating film 322 is disposed thereover, and the first electrodes 302 and the second electrodes 304 are simultaneously formed. The second electrodes 304 are connected to the connection portions 304a through openings, which are not illustrated, provided in the interlayer insulating film 322. Since detection of the touch is performed by sensing the variation of the potential of the second wirings 320 as described above, the parasitic capacitance between the opposing electrode 182 and the second wirings 320 and the influence thereof can be reduced by placing the interlayer insulating film 322 therebetween.

A leveling insulating film 324 is provided over the first wirings 310 and the second wirings 320 for absorbing or decreasing depressions and projections caused by the first electrodes 302 and the second electrodes 304, over which the polarizing plate 210 may be disposed through an adhesive layer which is not illustrated (FIG. 6A and FIG. 6B). The opposing substrate 104 may be provided over the polarizing plate 210 as an optional structure. The opposing substrate may contain the same material as the substrate 102.

4. Peripheral Structure

Referring to FIG. 4, the first wirings 310 and the second wirings 320 are connected to wirings 306 extending outside the display region 114. The wirings 306 extend to the side surface of the substrate 102 on which the terminals 122 are formed and are exposed between the edge portion of the substrate 102 and the display region 114 (frame) to form the terminals 120. The connector 126 to which the terminals 122 are connected can be connected to the terminals 120, by which signals for sensing a touch can be supplied to the touch sensor 300 from an external circuit which is not illustrated. Arrangement of the terminals 120 close to the terminals 122 enables not only the display region 114 but also the touch sensor 300 to be controlled by using one kind of the connector 126, thereby simplifying the manufacturing process.

Figure 9:
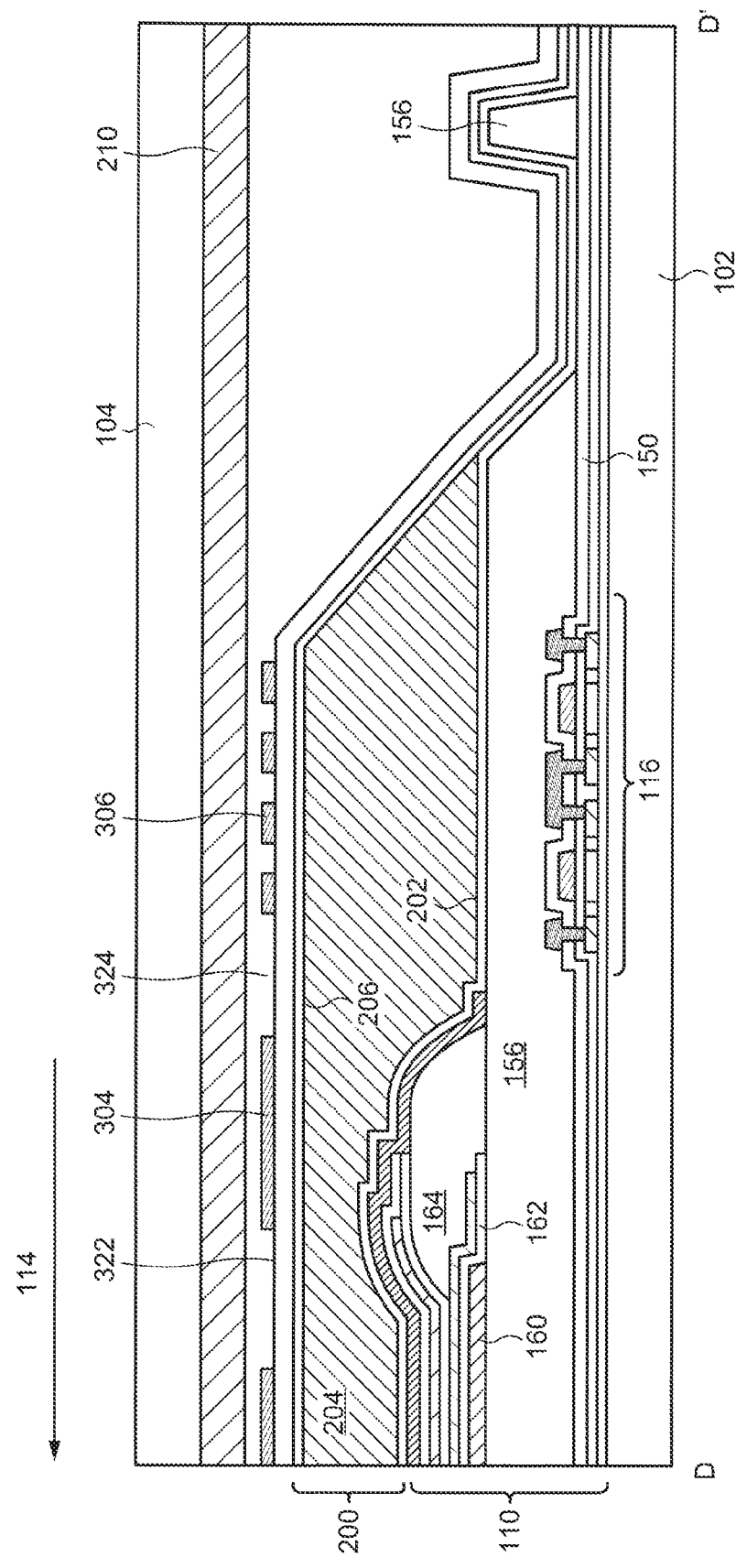
FIG. 9 is a schematic cross-sectional view of a display device according to an embodiment of the present invention.

A schematic cross-sectional view along a chain line D-D' in FIG. 4 is shown in FIG. 9. As shown in FIG. 9, the scanning-line driver circuit 116 is disposed between the edge portion (edge portion on a right side in the drawing) of the substrate 102 and the display region 114 (i.e., frame) in the circuit layer 110, over which the wirings 306 are provided in the frame through the passivation film 200 and the interlayer insulating film 322. A part of the leveling film 156 is removed in the frame, which allows the interlayer film 150 including a silicon-containing inorganic compound and the first layer 202 of the passivation film 200 to be in contact with each other. The second layer 204 of the passivation film 200 is formed so as not to reach the edge portion of the substrate 102 and sealed by the first layer 202 and the third layer 206. This structure prevents the leveling film 156 including an organic compound such as a resin from being exposed at the edge portion of the substrate 102, which suppresses entrance of impurities such as water and oxygen into the leveling film 156 and suppresses adverse influence on the light-emitting element 170 and the like.

As described above, the ratio R of the area S with respect to the total length A of the sides of at least one of the first electrode 302 and the second electrode 304 is adjusted within the aforementioned range in the touch sensor 300 of the present embodiment. As a result, the parasitic capacitance between the opposing electrode of the light-emitting element and the detecting wirings or between the opposing electrode and the driving wirings, and the variation of the potential of the detection wirings can be more correctly sensed. Hence, it is possible to provide a touch sensor with high detection sensitivity and detection accuracy as well as a display device on which the touch sensor is mounted.

Second Embodiment

In the present embodiment, a touch sensor 330 different in structure from the touch sensor 300 of the First Embodiment is explained. An explanation of the structures the same as those of the First Embodiment may be omitted.

Figure 10A:
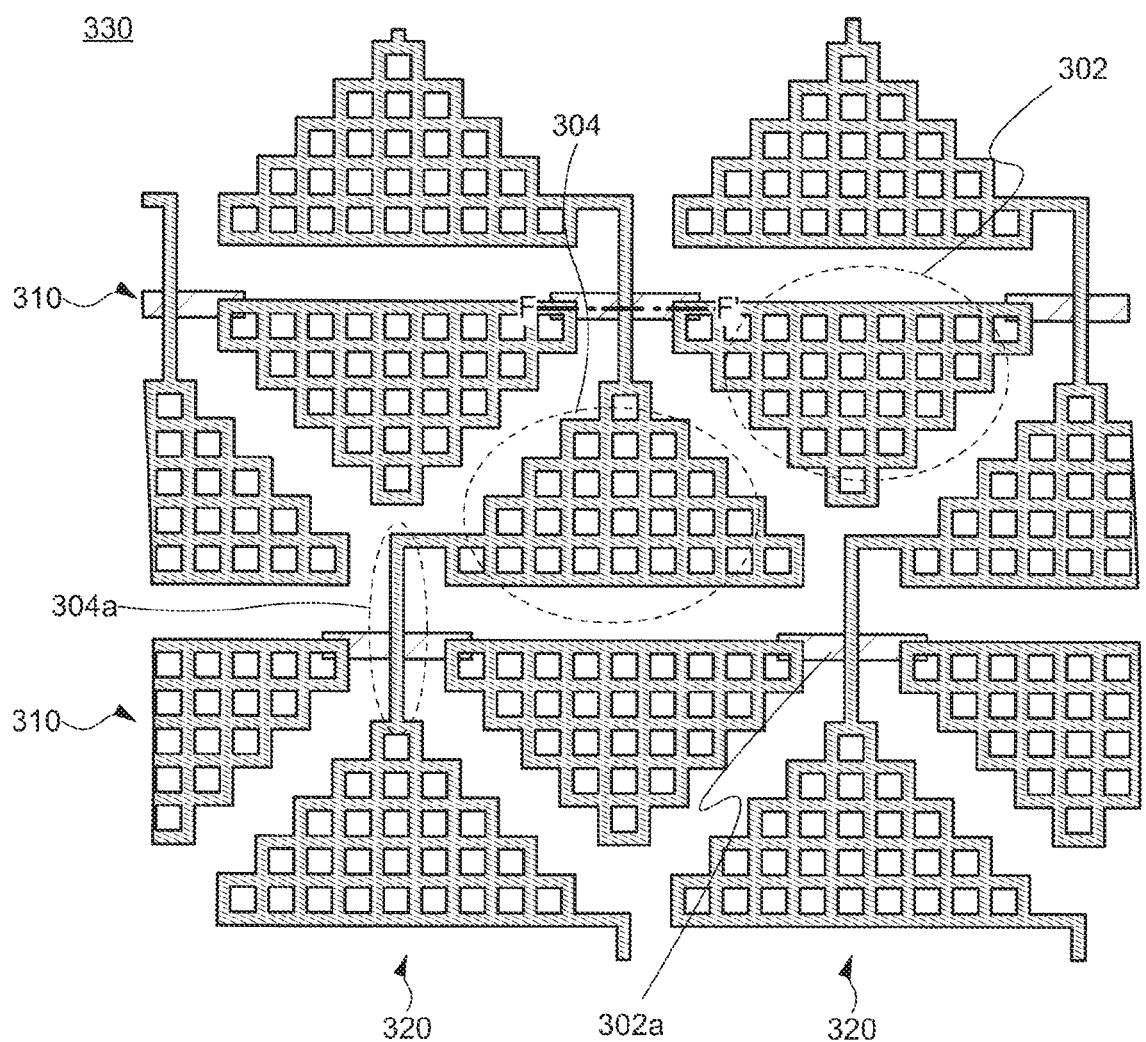
FIG. 10A and FIG. 10B are schematic top views of touch electrodes of a display device according to an embodiment of the present invention.

In the touch sensor 330, the shape of each of the first electrodes 302 and the second electrodes 304 is substantially the same as that of the touch sensor 300. However, the touch sensor 330 is different from the touch sensor 300 in that the first electrodes 302 and the second electrodes 304 are mesh-shaped. Specifically, each of the first electrodes 302 and the second electrodes 304 has a plurality of openings, and the pixels 112 are arranged so as to overlap with the openings as shown in FIG. 10A. Additionally, each of the first electrodes 302 and the second electrodes 304 varies stepwise in width in the row direction and the column direction.

Figure 11:
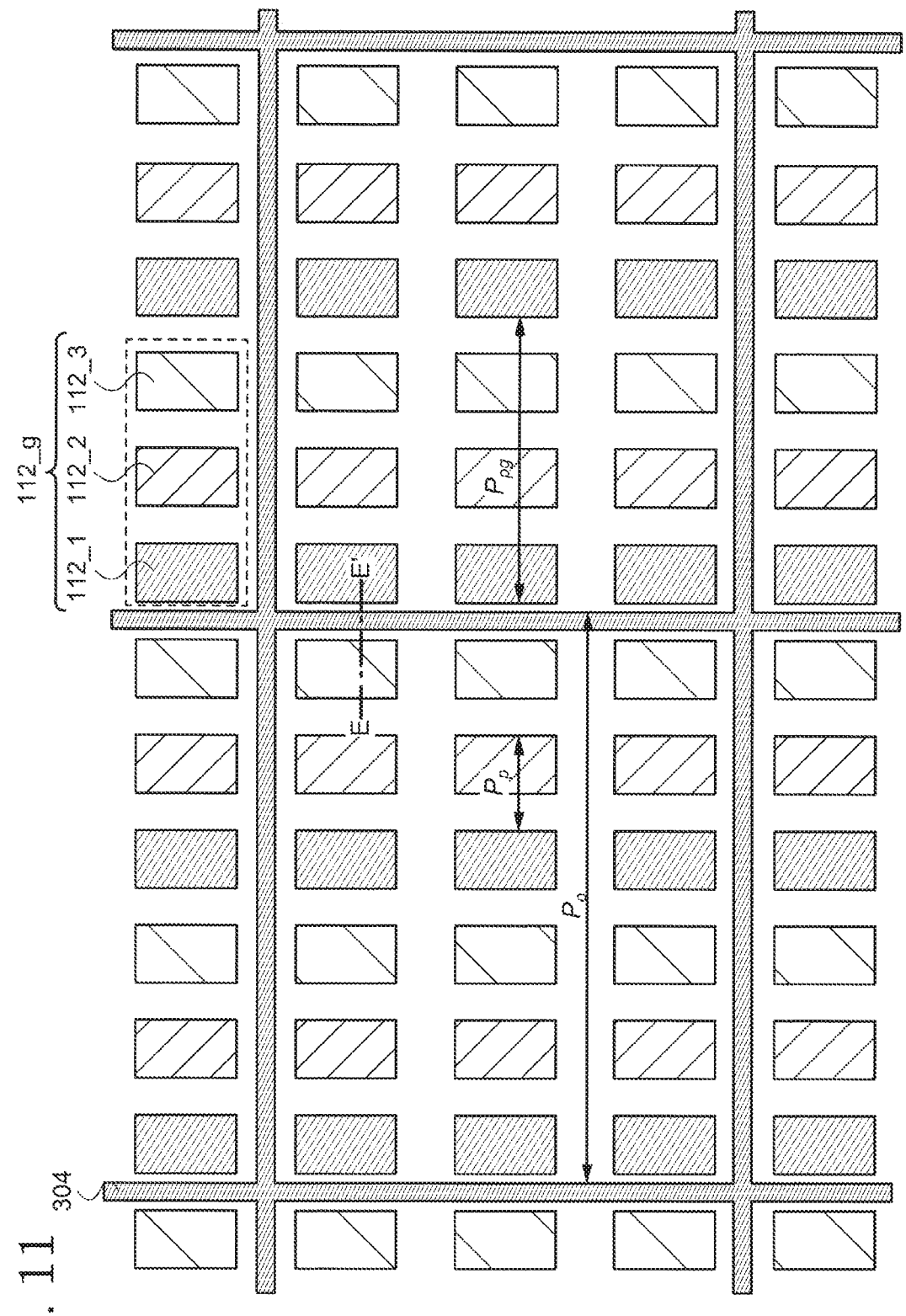
FIG. 11 is a schematic top view of a display device according to an embodiment of the present invention.

An enlarged view of the pixels 112 overlapping with the touch sensor 330 is shown in FIG. 11. Here, the second electrode 304 and the plurality of pixels 112 formed thereunder and arranged in a stripe shape are illustrated as an example. In a stripe arrangement, the plurality of pixels 112 giving colors different from one another is arranged in a matrix form having a plurality of rows and columns. Combination of the colors obtained from the plurality of pixels 112 gives white color. A combination of the pixels 112 which gives white color and has the smallest number of the pixels 112 is a pixel group 112_g, and the pixels 112_1, 112_2, and 112_3 correspond to one pixel group 112_g in FIG. 11.

Although not illustrated, one pixel 112 may overlap with the opening of the second electrode 304. With such a structure, a touch sensor with sufficiently high detection sensitivity and excellent detection accuracy can be provided even if a width of the electrode passing between the pixels 112 is decreased. Furthermore, one or more of the pixel groups 112_g may overlap with the opening of the second electrode 304 as shown in FIG. 11. In this case, three or more of the pixels 112 overlap with the opening of the second electrode 304. The second electrode 304 and the pixels 112 are arranged so that a region (hereinafter, referred to as a mesh wiring) between the adjacent openings is located between the adjacent pixels 112. Therefore, a pitch $P_o$ of the mesh wiring (i.e., a pitch of the opening) is an integer multiple of a pitch $P_p$ of the pixels 112. Additionally, the pitch $P_o$ may be an integer multiple of a pitch $P_{pg}$ of the pixel groups 112_g. That is, the plurality of pixel groups 112_g may be arranged in a region overlapping with the opening of the second electrode 304. Although not illustrated, the layout of the first electrodes 302 and the pixels 112 is the same. Such a structure is particularly preferred in a display device with high resolution, and not only provides a touch sensor with high detection sensitivity and excellent detection accuracy but also enables effective use of the light emission, which contributes to reduction of power consumption. In particular, it is possible to suppress influence on luminance and color properties of the light emission in an inclined direction.

Figure 12:
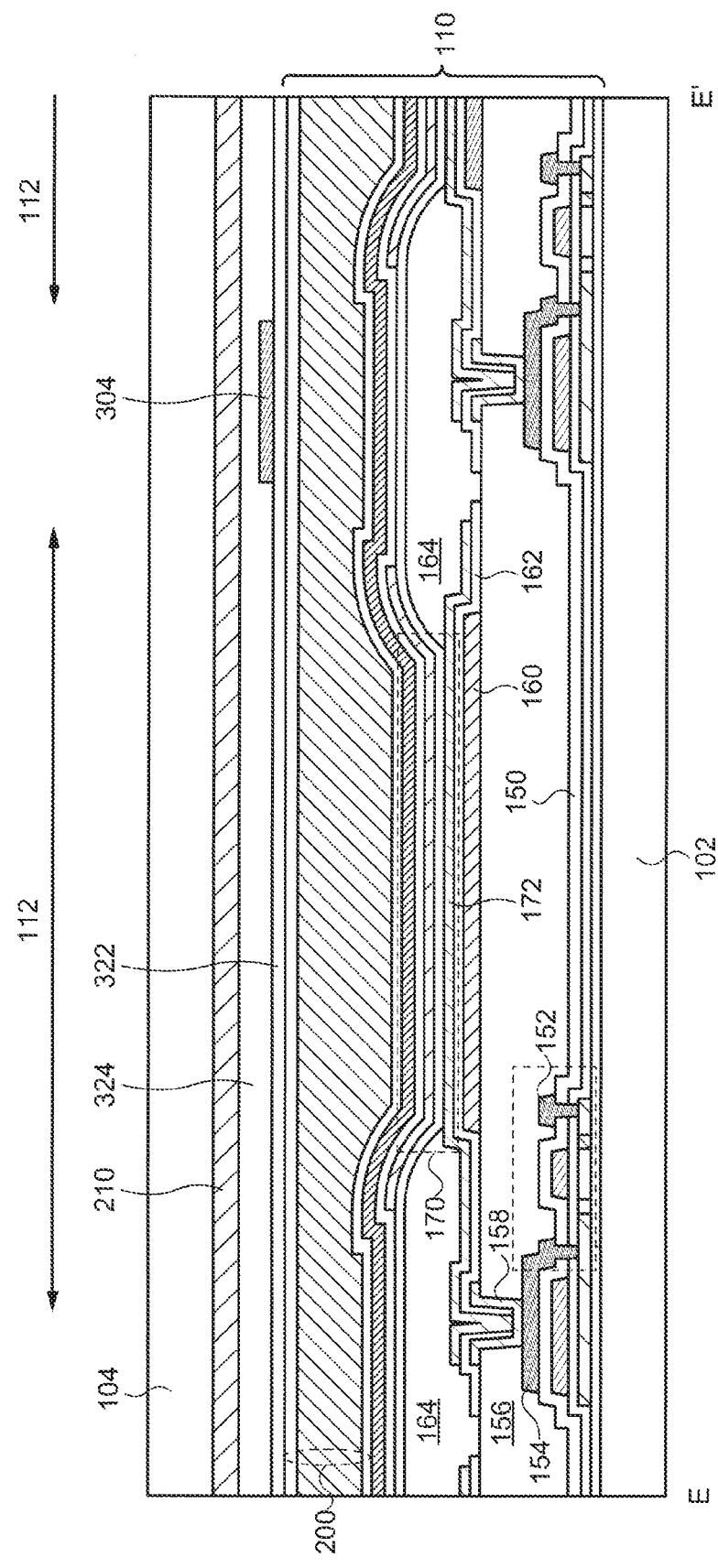
FIG. 12 is a schematic cross-sectional view of a display device according to an embodiment of the present invention.

A cross-sectional view along a chain line E-E' in FIG. 11 is schematically shown in FIG. 12. As shown in FIG. 12, the mesh wiring is formed so as to overlap with the partition wall 164 located between adjacent pixels 112. The mesh wiring is not disposed in a region other than the region overlapping with the partition wall 164 and may be formed so as to be confined in this region. Since the mesh wiring does not overlap with the pixels 112, the light emission from the pixels 112 is not shielded. Therefore, the light emission from the light-emitting elements 170 can be effectively utilized, which contributes to reduction of power consumption. Moreover, the mesh wiring can include a metal with high conductivity and may be provided with a sufficient thickness to secure a low sheet resistance. Hence, the resistance of the first electrodes 302 and the second electrodes 304 is low, and the time constant of response to a touch can be decreased. As a result, the response rate as a touch sensor can be increased.

Figure 10B:
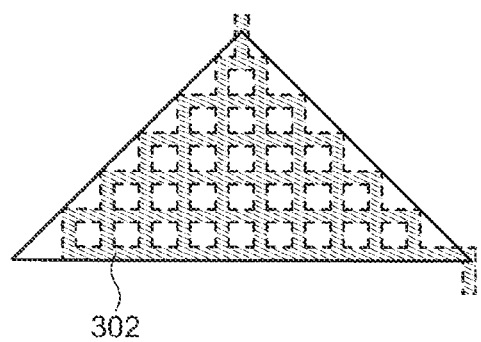

Note that, as described in the First Embodiment, the shape of the mesh-shaped first electrodes 302 and the second electrodes 304 may be a polygonal including an equilateral triangle, a triangle, an isosceles triangle, a right-angle triangle, and a right-angle isosceles triangle. In this case, a polygonal (a triangle, a quadrangle, a pentagon, a hexagon, a heptagon, or an octagon) which is able to surround a region with a stepwise variable width, to which the region inscribes, and which has the minimum area is defined as the shape of the first electrodes 302 and the second electrodes 304 as shown in FIG. 10B.

Figure 13:
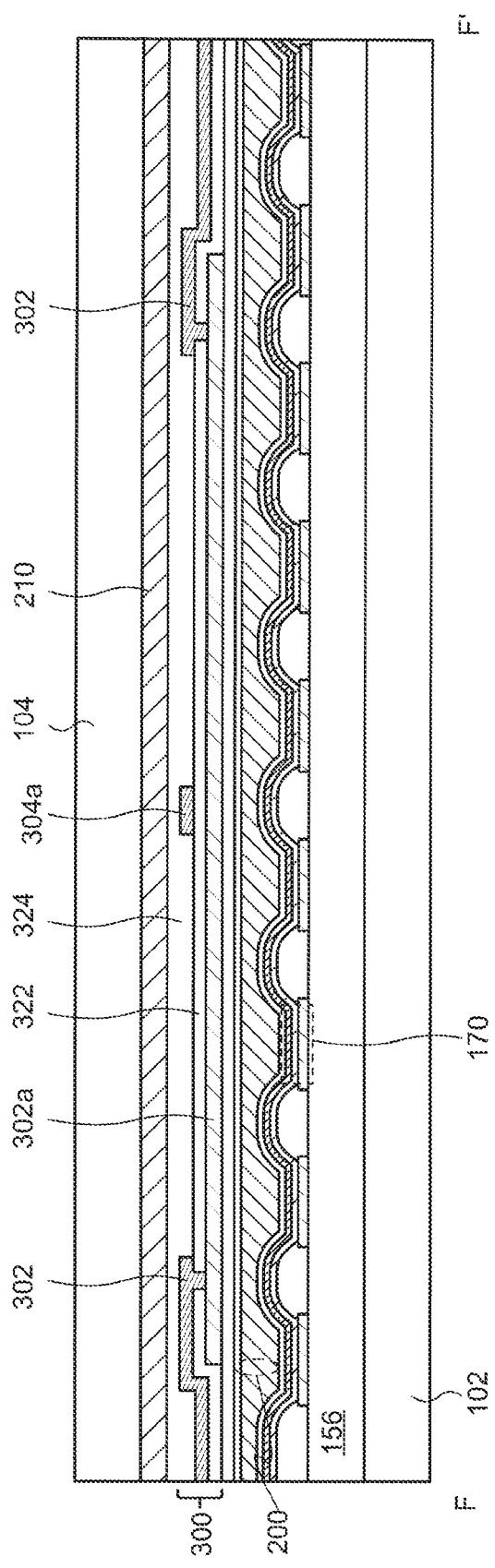
FIG. 13 is a schematic cross-sectional view of a display device according to an embodiment of the present invention.

In the example shown in FIG. 10A, the first electrodes 302 and the second electrodes 304 are formed in the same layer, and the connection portions 302a of the first electrodes 302 are disposed between the passivation film 200 and the interlayer insulating film 322 as shown in a schematic cross-sectional view (FIG. 13) along a chain line F-F' in FIG. 10A. On the other hand, the first electrodes 302 and the second electrodes 304 are formed over the interlayer insulating film 322, and the adjacent first electrodes 302 are electrically connected by the connection portion 302a in the opening portion formed in the interlayer insulating film 322. Although not illustrated, the structure of the touch sensor 330 is not limited thereto, and the interlayer insulating film 322 may be formed over the first electrodes 302 and the second electrodes 304, over which the connection portions 302a may be disposed. Moreover, the first electrodes 302 and the second electrodes 304 may exist in different layers. In this case, the first electrodes 302 and their connection portions 302a are simultaneously formed, and the second electrodes 304 and the connection portions 304a are simultaneously formed after covering the first electrodes 302 and the connection portions 302a.

Figure 14:
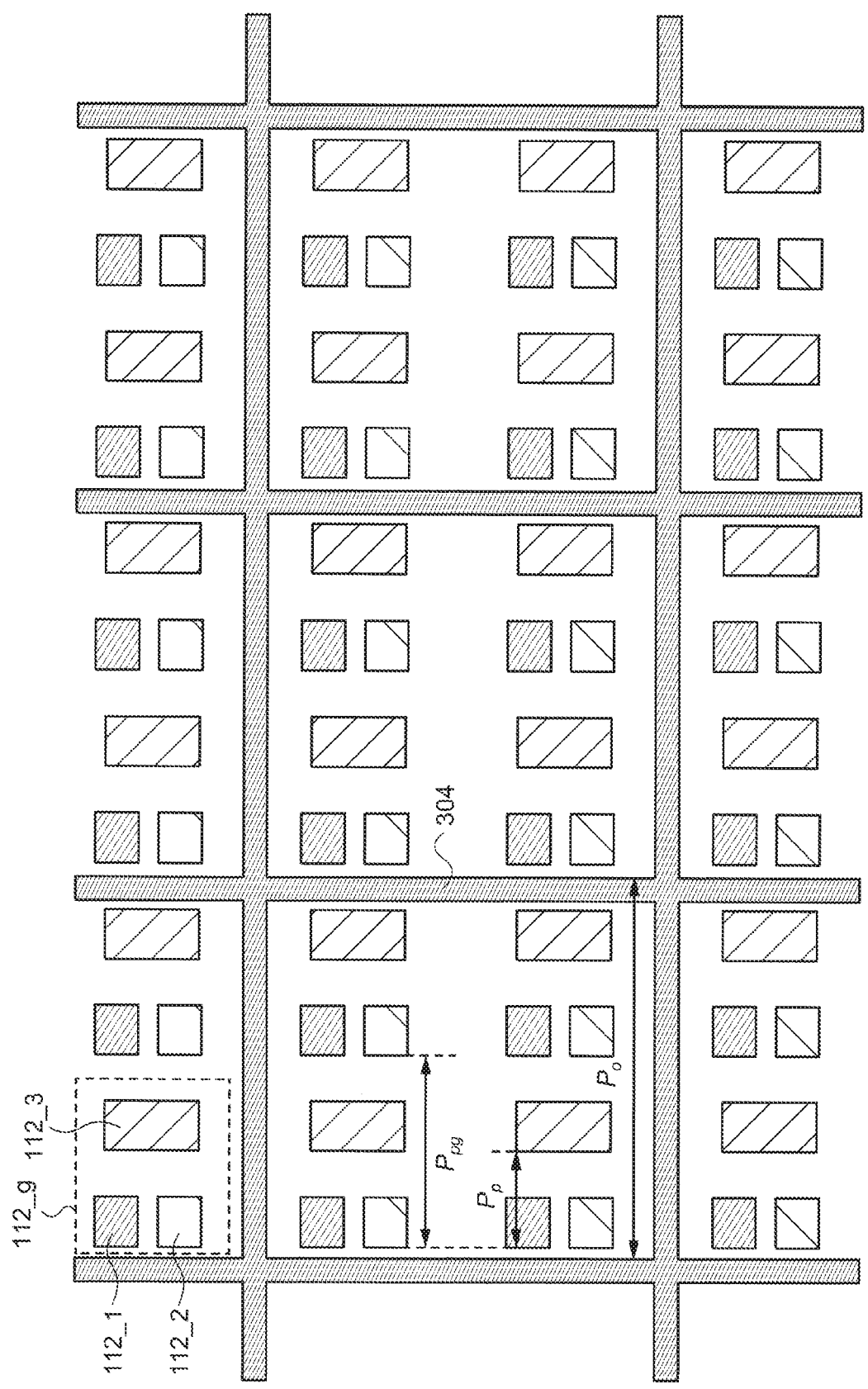
FIG. 14 is a schematic top view of a display device according to an embodiment of the present invention.
Figure 15:
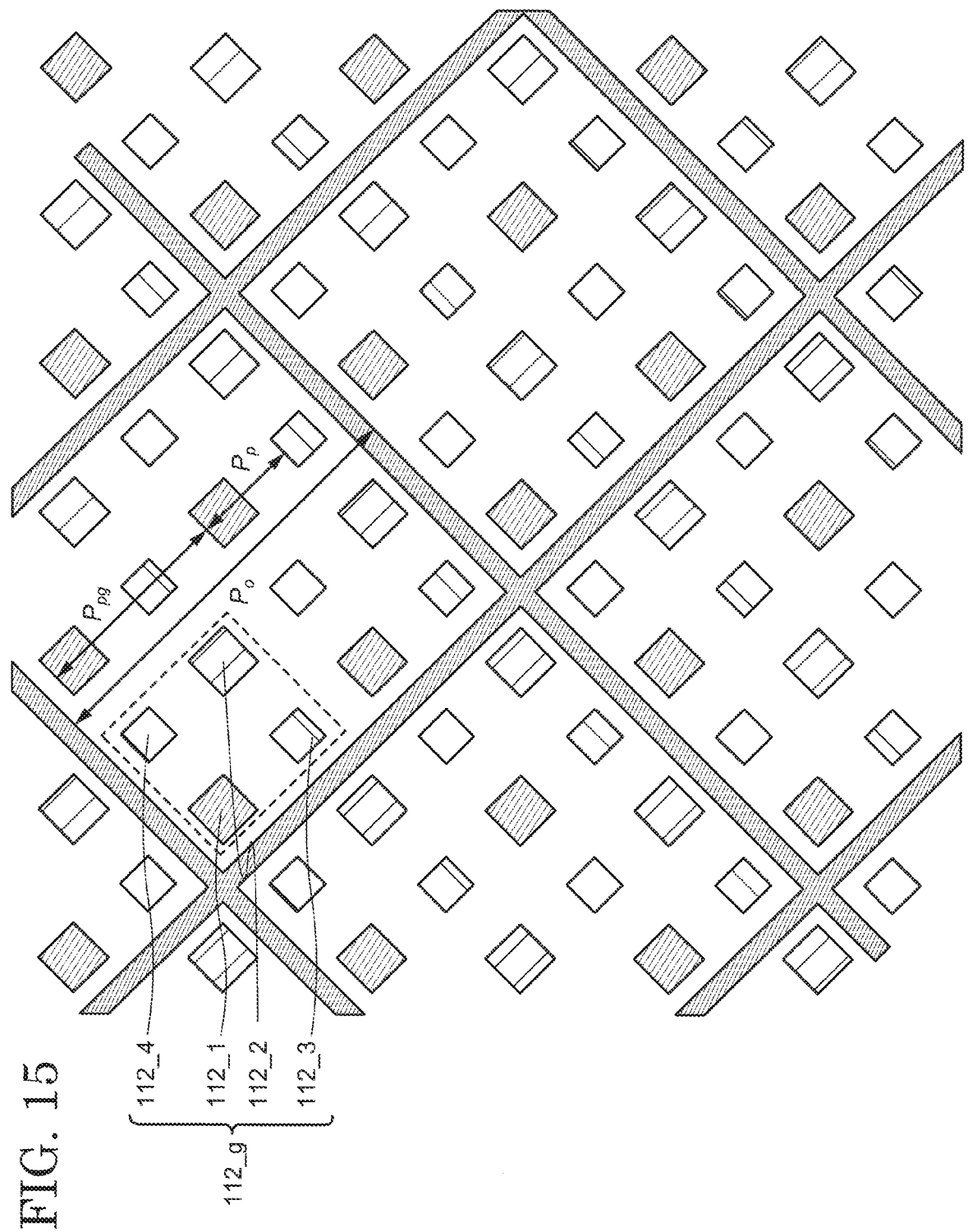
FIG. 15 is a schematic top view of a display device according to an embodiment of the present invention.

Arrangement of the pixels 112 is not limited to the stripe arrangement. For example, an arrangement may be selected in which an area of one pixel 112 (pixel 112_3 in this case) is different from areas of other pixels (pixels 112_1 and 112_2 in this case) in one pixel group 112_g, and the two pixels 112 are arranged in the same column as shown in FIG. 14. In this case, the mesh wiring also may be arranged so that the pitch $P_o$ of the mesh wiring is an integer multiple of the pitch $P_p$ of the pixels 112 and the pitch $P_{pg}$ of the pixel groups 112_g. Furthermore, an arrangement may be employed in which one pixel group 112_g is structured by four pixels 112_1, 112_2, 112_3, and 112_4, these pixels are arranged at vertexes of a quadrangle, and diagonal lines of the quadrangle are parallel to the long side and the short side of the display region 114 as shown in FIG. 15. In this case, the mesh wiring is arranged so as to be inclined from the long side and the short side of the display region 114. Hence, the first electrodes 302 and the second electrodes 304 each vary stepwise in width in a direction inclined from the row direction and the column direction.

As describe above, implementation of the present embodiment enables production of a touch sensor having low power consumption and high response rate and a display device on which the touch sensor is mounted.

Third Embodiment

Figure 16:
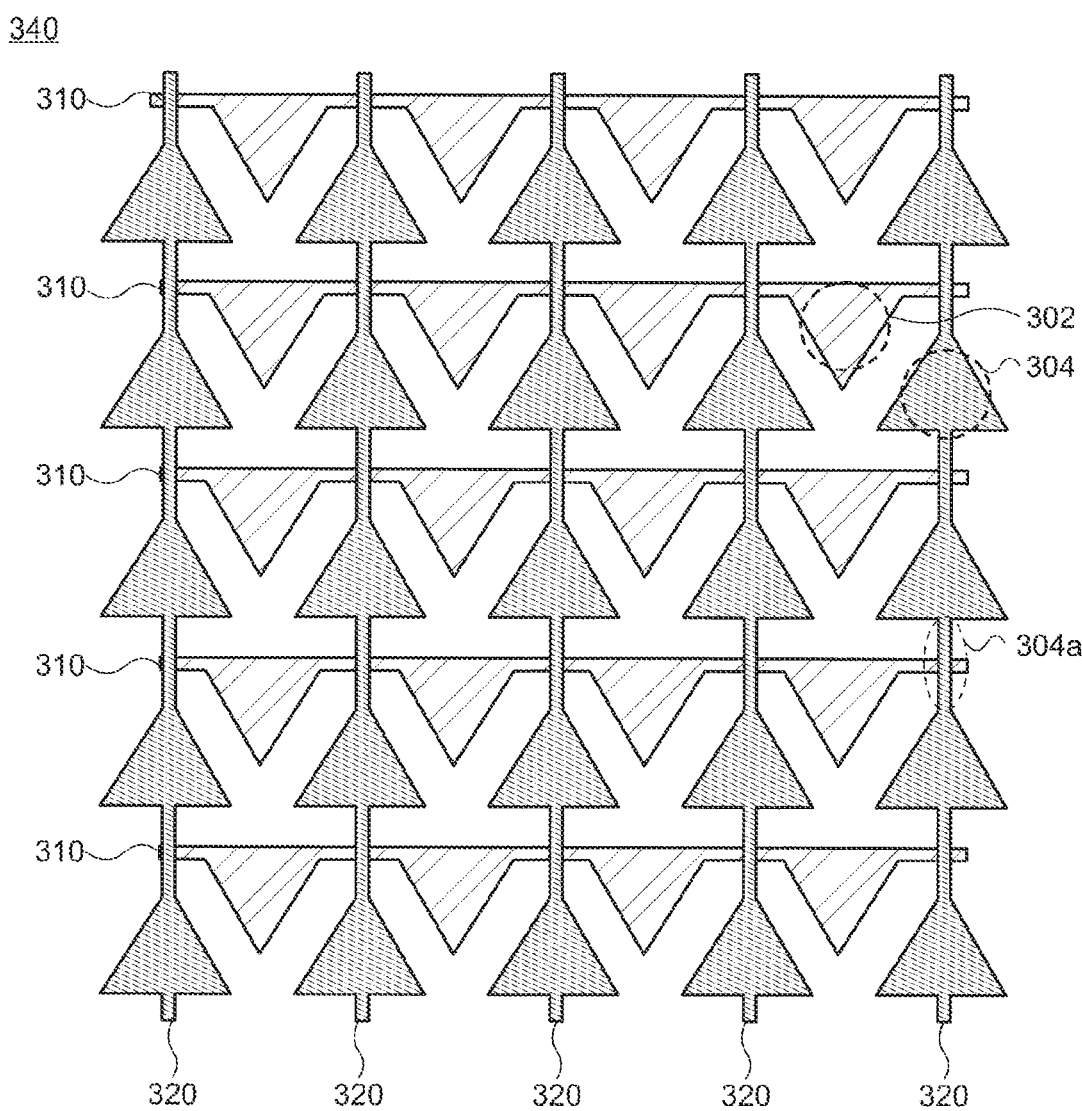
FIG. 16 is a schematic top view of touch electrodes of a display device according to an embodiment of the present invention.
Figure 17:
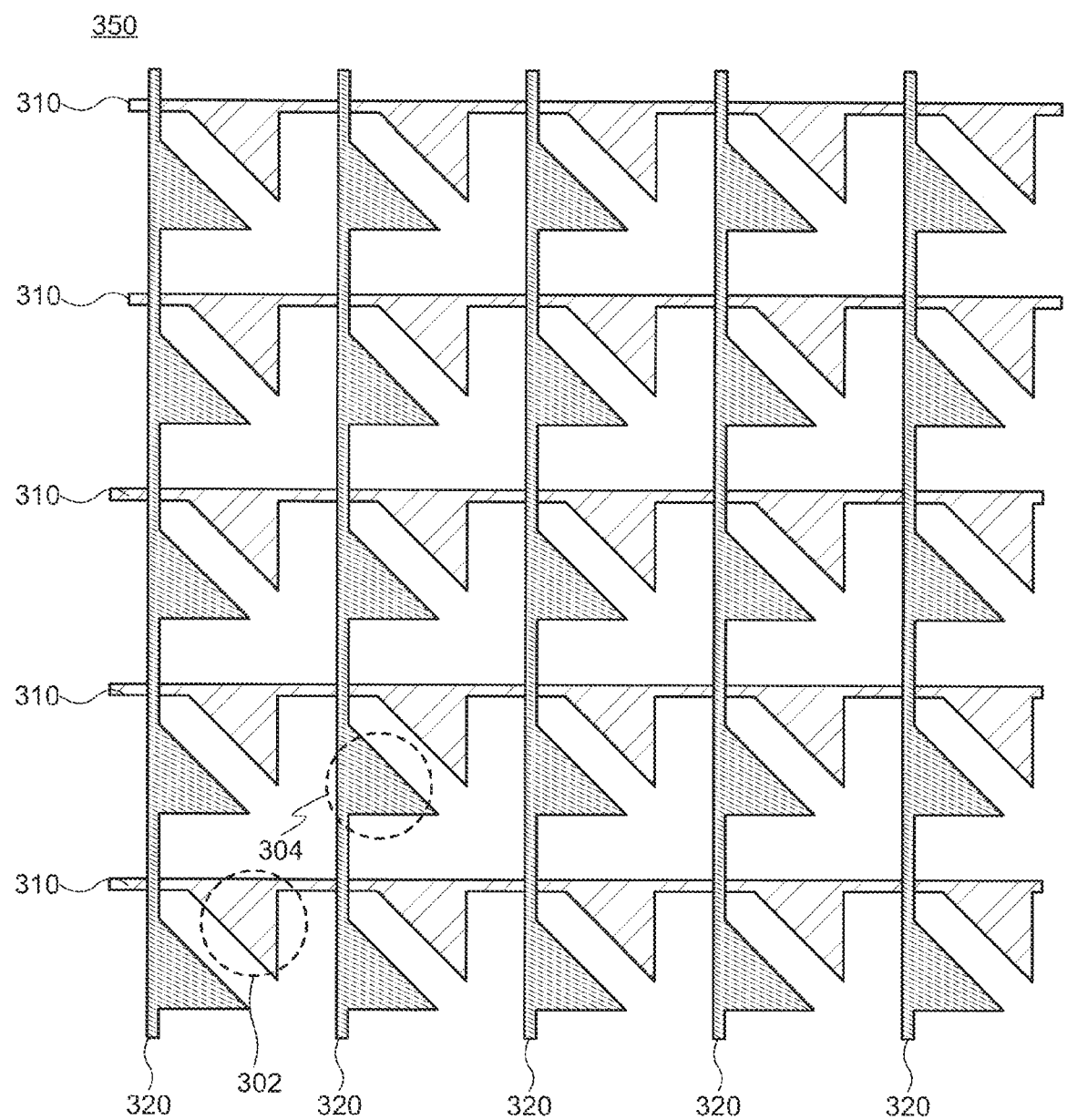
FIG. 17 is a schematic top view of touch electrodes of a display device according to an embodiment of the present invention.

In the present embodiment, touch sensors 340 and 350 different from the touch sensor 300 of the First Embodiment are explained by using FIG. 16 and FIG. 17. An explanation of the structures the same as those of the First and Second Embodiments may be omitted.

The touch sensor 340 is different from the touch sensor 300 in the arrangement of the first electrodes 302 and the second electrodes 304. Specifically, the first electrodes 302 are not shifted but overlap with each other in the column direction between the adjacent first wirings 310 as shown in FIG. 16. Similarly, the second electrodes 304 are not shifted but overlap with each other in the column direction in the same two wiring 320. Therefore, the first electrodes 302 and the second electrodes 304 are linearly arranged in the row direction and the column direction, respectively. In this case, one second electrode 304 is surrounded by four first electrodes 302. That is, one receiving electrode is surrounded by two adjacent transmitting electrodes included in the kth transmitting wiring and two adjacent transmitting electrodes included in the (k+1) transmitting wiring. Moreover, a side of this receiving electrode is parallel to a side of one of the transmitting electrodes and a side of the other of the transmitting electrodes of the (k+1) transmitting wiring.

The connection portions 304a electrically connecting the adjacent second electrodes 304 are arranged parallel to the direction in which the second wirings 320 extend. Therefore, the length of the connection portions 304a can be reduced, by which the resistance of the second wirings 320 can be reduced. As a result, the time constant of response to a touch can be decreased.

As shown in FIG. 17, the touch sensor 350 is different from the touch sensor 340 in that the shape of the first electrodes 302 and the second electrodes 304 is a right-angle triangle. When the first electrodes 302 and the second electrodes 304 are right-angle triangles, the ratio R of the area S with respect to the total length of the sides can be decreased in each of the first electrodes 302 and the second electrodes 304. Specifically, when the total length of the sides is A, the ratio is 0.0429 A. Thus, higher detection sensitivity and detection accuracy can be realized.

Fourth Embodiment

In the present embodiment, touch sensors 360, 370, 380, and 390 different from the touch sensor 300 of the First Embodiment are explained by using FIG. 18 to FIG. 21. An explanation of the structures the same as the Third Embodiment may be omitted.

The touch sensor 360 is different from the touch sensor 300 and the like in that one second electrode 304 (receiving electrode) forms capacitance with the plurality of first electrodes 302 (transmitting electrodes) surrounding the second electrode 304 and the plurality of first electrodes 302 are connected to three different first wirings (transmitting wirings) 310.

Figure 18:
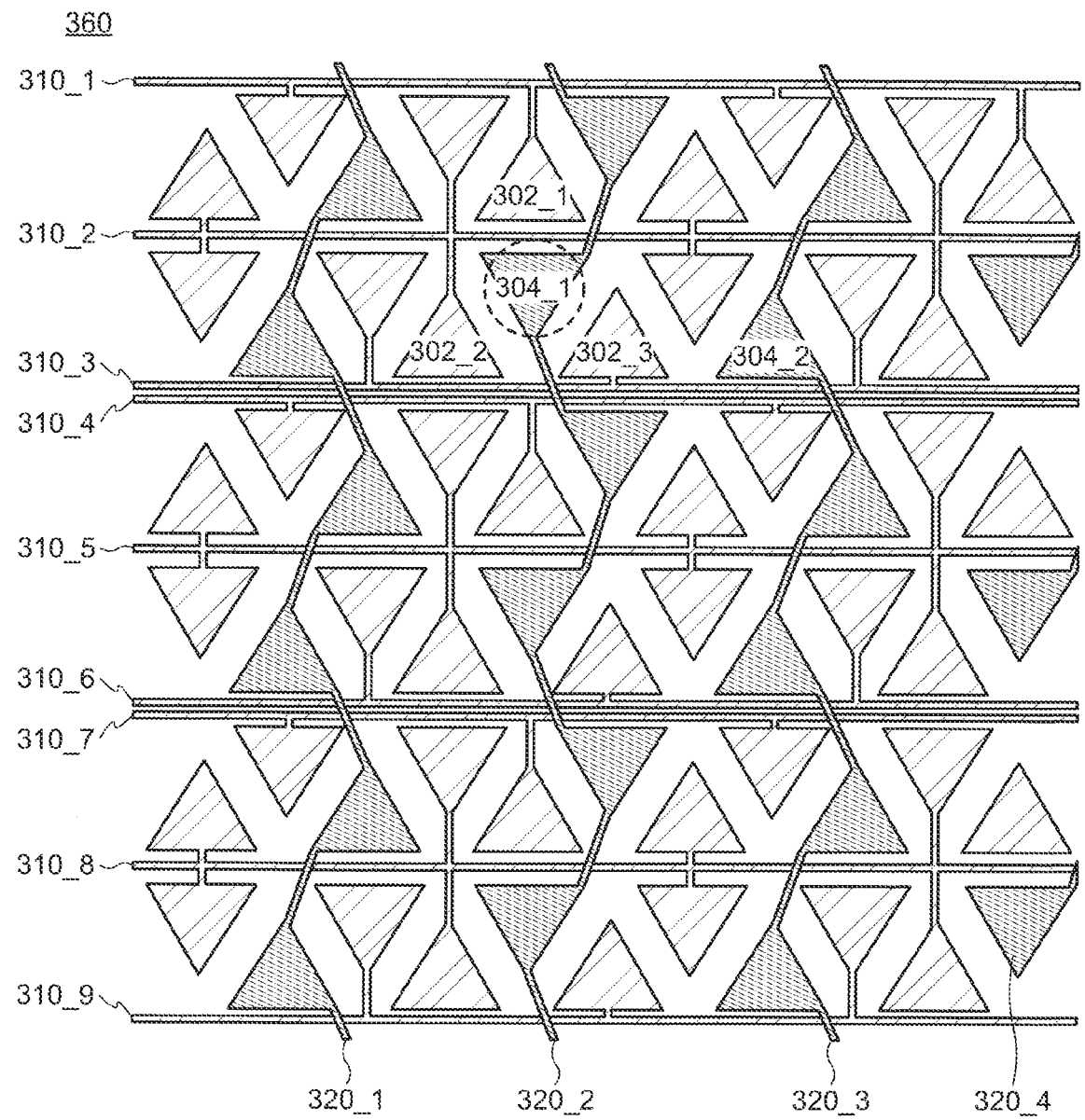
FIG. 18 is a schematic top view of touch electrodes of a display device according to an embodiment of the present invention.

More specifically, the touch sensor 360 possesses the plurality of first wirings (first to nth transmitting wirings) 310 arranged in a stripe form and the plurality of second wirings (first to mth receiving wirings) arranged in a stripe form and intersecting the first wirings 310 as shown in FIG. 18. Each of the first wirings 310 is connected to the plurality of first electrodes (transmitting electrodes) 302, and each of the second wirings 320 is connected to the plurality of second electrodes (transmitting electrodes) 304. Nine first wirings 310_1 to 310_9 and four second wirings 320_1 to 320_4 are illustrated in FIG. 18.

In a series of three first wirings 310 (that is, kth to (k+2)th transmitting electrodes), arrangement of the first electrodes 302 connected thereto is different from one another. For example, when the kth transmitting wiring is the first wiring 310_4, the first electrodes 302 located on one side with respect to the first wiring 310_4 are connected to the first wiring 310_4. Similarly, the first electrodes 302 located on one side with respect to the first wiring 310_6 are connected to the first wiring 310_6 which is the (k+2) transmitting wiring. Additionally, the first electrodes 302 connected to the first wiring 310_4 or the first wiring 310_6 are sandwiched by the first wiring 310_4 and the first wiring 310_6. On the other hand, the first wiring 310_5 sandwiched by the first electrode 310_4 and the first wiring 310_6 is the (k+1)th transmitting wiring to which the first electrodes 302 located on both sides with respect to the first wiring 310_5 are connected.

In the touch sensor 360, the number of the first electrodes 302 and the number of the second electrodes 304, which are sandwiched between two adjacent first wirings 310, are different from each other, and the former is more than the latter. Two first electrodes 302 are sandwiched between two second electrodes 304 adjacent to each other between two adjacent first wirings 310. Therefore, the number of the second electrodes 304 which more strongly exert the influence of the parasitic capacitance with the opposing electrode 182 of the light-emitting element 170 can be reduced.

The second electrode 304 of the touch sensor 360 is surrounded by three first electrodes 302 respectively connected to the series of three first wirings 310. For example, the second electrode 304_1 shown in FIG. 18 is surrounded by the first electrode 302_1 connected to the first wiring 310_1 (transmitting electrode connected to the kth transmitting wiring), the first electrode 302_2 connected to the first wiring 310_2 (transmitting electrode connected to the (k+1)th transmitting wiring), and the first electrode 302_3 connected to the first wiring 310_3 (transmitting electrode connected to the (k+2)th transmitting wiring) and forms capacitance with each of these electrodes. In other words, one second wiring 320 forms capacitance with three first wirings 310. Note that the second electrode 304_2 of the second wiring 320_3 adjacent to the second wiring 320_2 does not form capacitance with the first electrodes 302_1, 302_2, and 302_3 which form capacitance with the second electrode 304_1 of the second wiring 320_2.

Figure 19:
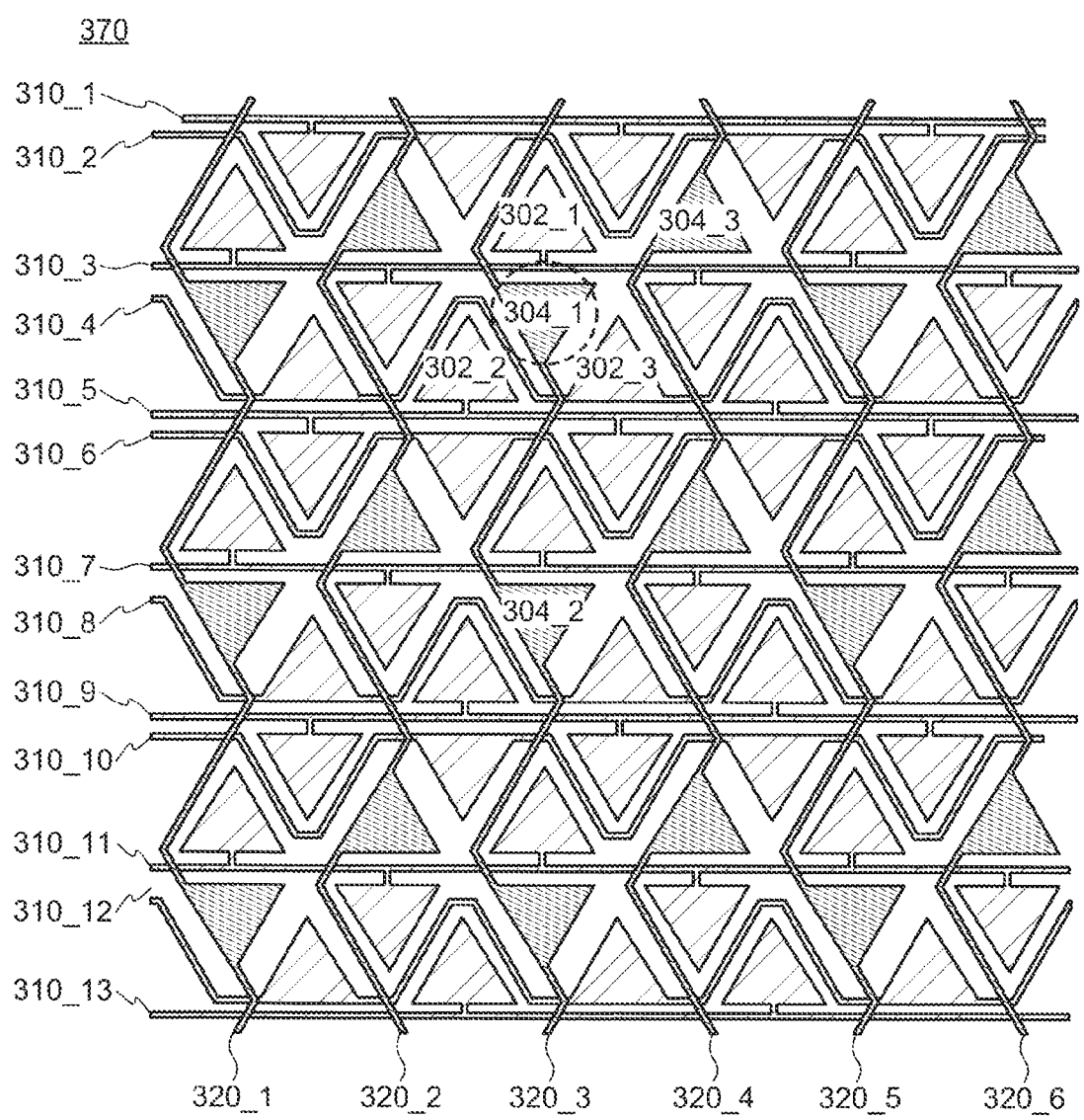
FIG. 19 is a schematic top view of touch electrodes of a display device according to an embodiment of the present invention.
Figure 20:
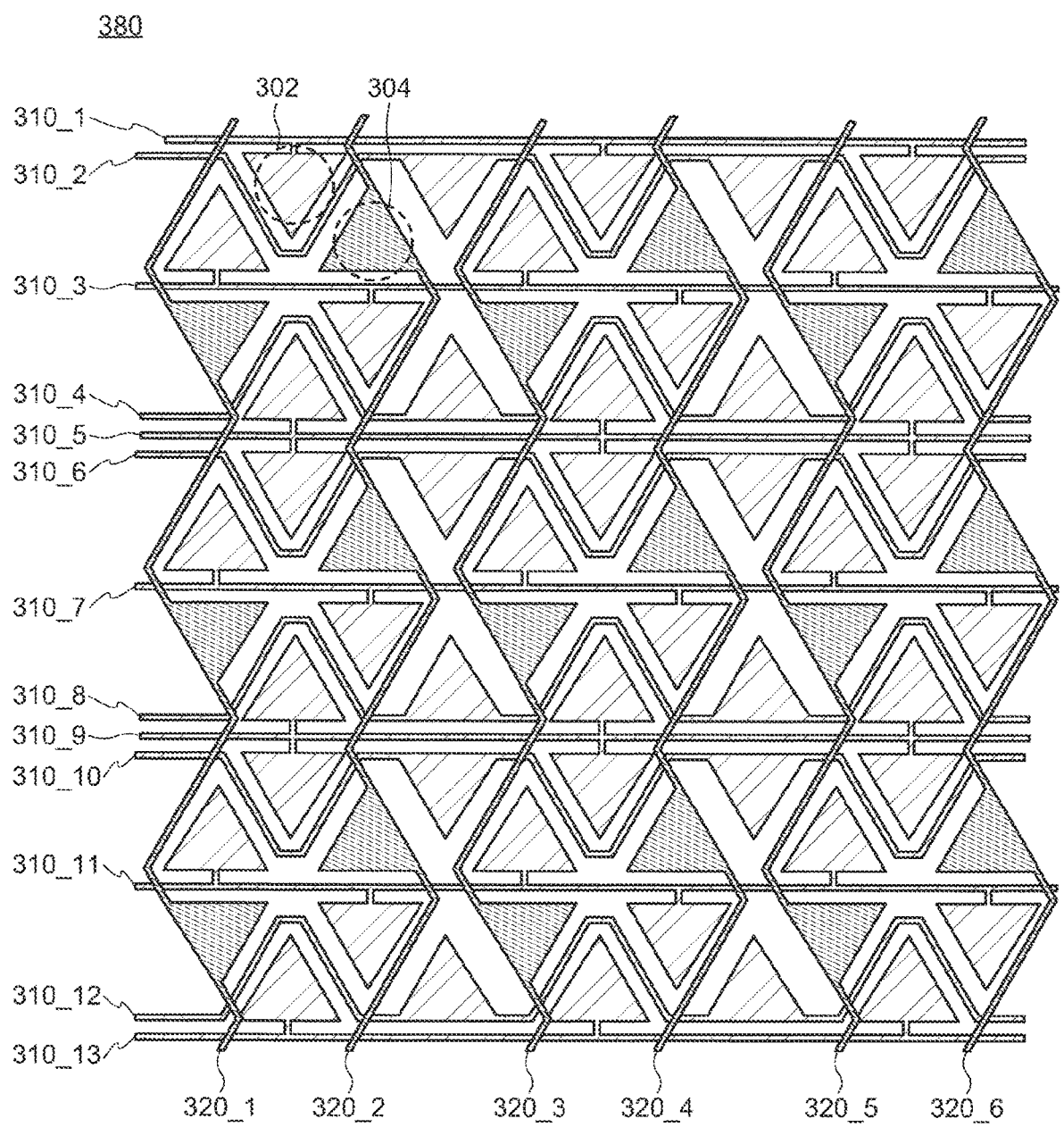
FIG. 20 is a schematic top view of touch electrodes of a display device according to an embodiment of the present invention.

The touch sensor 370 shown in FIG. 19 is different from the touch sensor 360 in that three first electrodes 302 forming capacitance with one second electrode 304 do not form capacitance with other second electrodes 304 (that is, do not share the second electrode 304). Specifically, the second electrode 304_1 is surrounded by the first electrode 302_1 connected to the first wiring 310_3 (transmitting electrode connected to the kth transmitting wiring), the first electrode 302_3 connected to the first wiring 310_4 (transmitting electrode connected to the (k+1)th transmitting wiring), and the first electrode 302_2 connected to the first wiring 310_5 (transmitting electrode connected to the (k+2)th transmitting wiring) and forms capacitance with each of these electrodes. The second electrode 304_2 connected to the same second wiring 320_3 and adjacent to the second electrode 304_1 does not form capacitance with the first electrodes 302_1, 302_2, and 302_3 forming capacitance with the second electrode 304_1. Similarly, the second electrode (e.g., second electrode 304_3) of the second wiring 320_4 adjacent to the second wiring 320_3 does not form capacitance with the first electrodes 302_1, 302_2, and 302_3.

Similar to the touch sensor 300, capacitive coupling occurs via a touch by a user in the touch sensors 360 and 370 and is detected as a variation in the waveform of a voltage of the second wirings 320. Therefore, more accurate touch detection can be realized because a touch can be detected as a variation of coupling signals with three different kinds of transmitting wirings. Furthermore, since the ratio R of the area S with respect to the total length A of the sides of the second electrode 304 is low, the parasitic capacitance between the opposing electrode of the light-emitting element and the driving wirings and between the opposing electrode of the light-emitting element and the detecting wirings can be reduced, allowing the variation of the potential of the detecting wirings to be more correctly sensed. As a result, a touch sensor with high detection sensitivity and excellent detection accuracy and a display device on which the touch sensor is mounted can be provided.

Arrangement of the first electrodes 310 and the second electrodes 320 is not limited to that shown in FIG. 19. For example, as demonstrated by the touch sensor 380 shown in FIG. 20, the first wirings 310 adjacent to each other and sandwiching one first wiring 310 may have a line-symmetry arrangement with respect to the sandwiched first wiring 310. For example, the first wirings 310_4 and 310_6 sandwiching the first wiring 310_5 ((k+1)th transmitting wiring) and adjacent to each other have a line-symmetry arrangement with respect to the first wiring 310_5.

Figure 21:
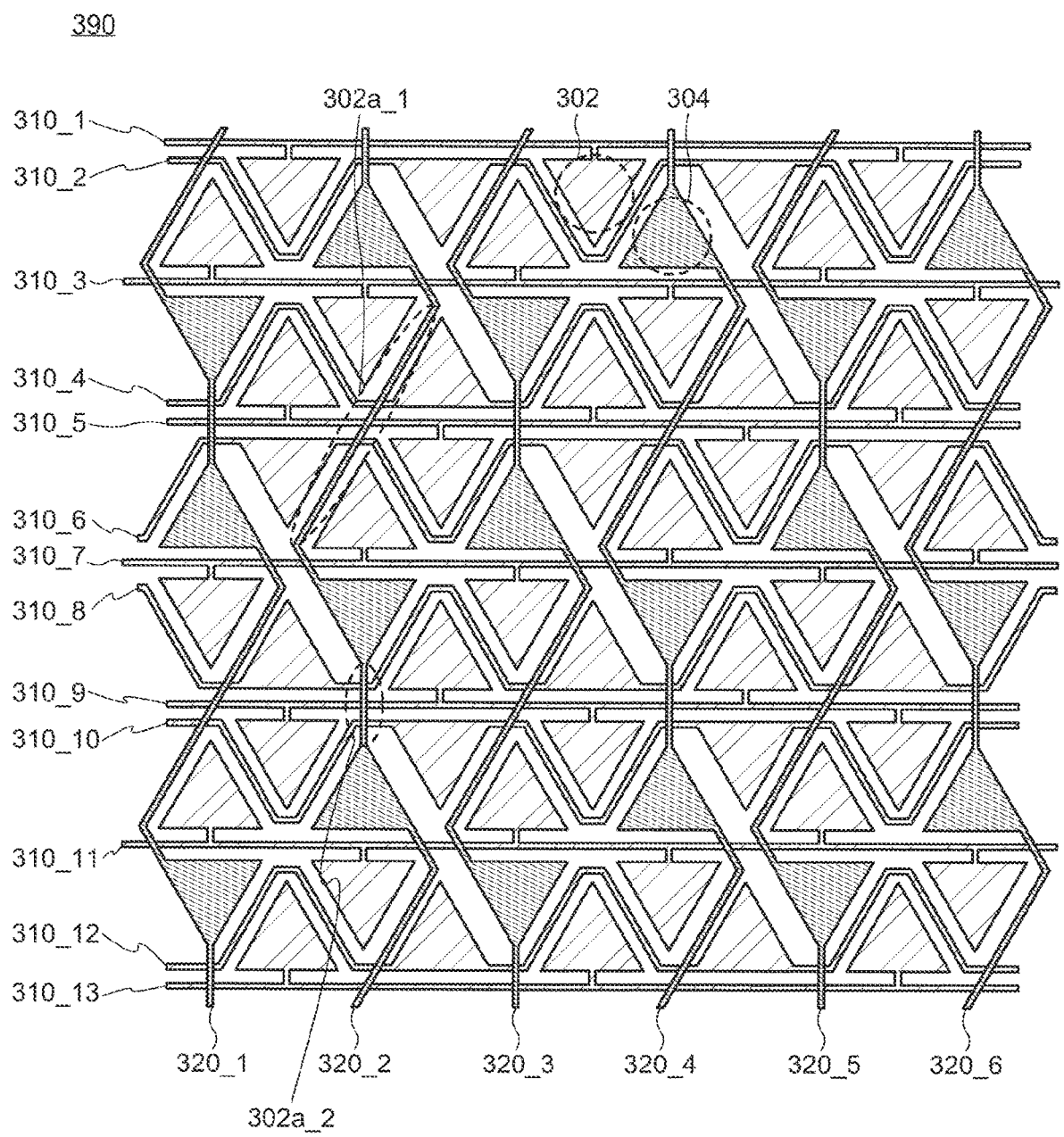
FIG. 21 is a schematic top view of touch electrodes of a display device according to an embodiment of the present invention.

Alternatively, as demonstrated by the touch sensor 390 shown in FIG. 21, the first wirings 310 and the second wirings 320 may be arranged so that the number of the first wirings 310 overlapped by the connection portions 302a provided in the same second wiring 320 and adjacent to each other periodically varies. In the example shown in FIG. 21, the connection portion 302a_1 of the second wiring 320_2 overlaps with five first wirings 310_3 to 310_7, while the connection portion 302a_2 overlaps with three first wirings 310_8 to 310_10. A part of the connection portion 302a (here, the connection portion 302a_2, for example) may be parallel to the direction in which the second wirings 320 extend.

Fifth Embodiment

In the present embodiment, touch sensors 400, 410, 420, and 430 different from the touch sensors 360, 370, 380, and 390 are explained by using FIG. 22A to FIG. 26. An explanation of the structures the same as those of the First to Fourth Embodiments may be omitted.

Figure 22A:
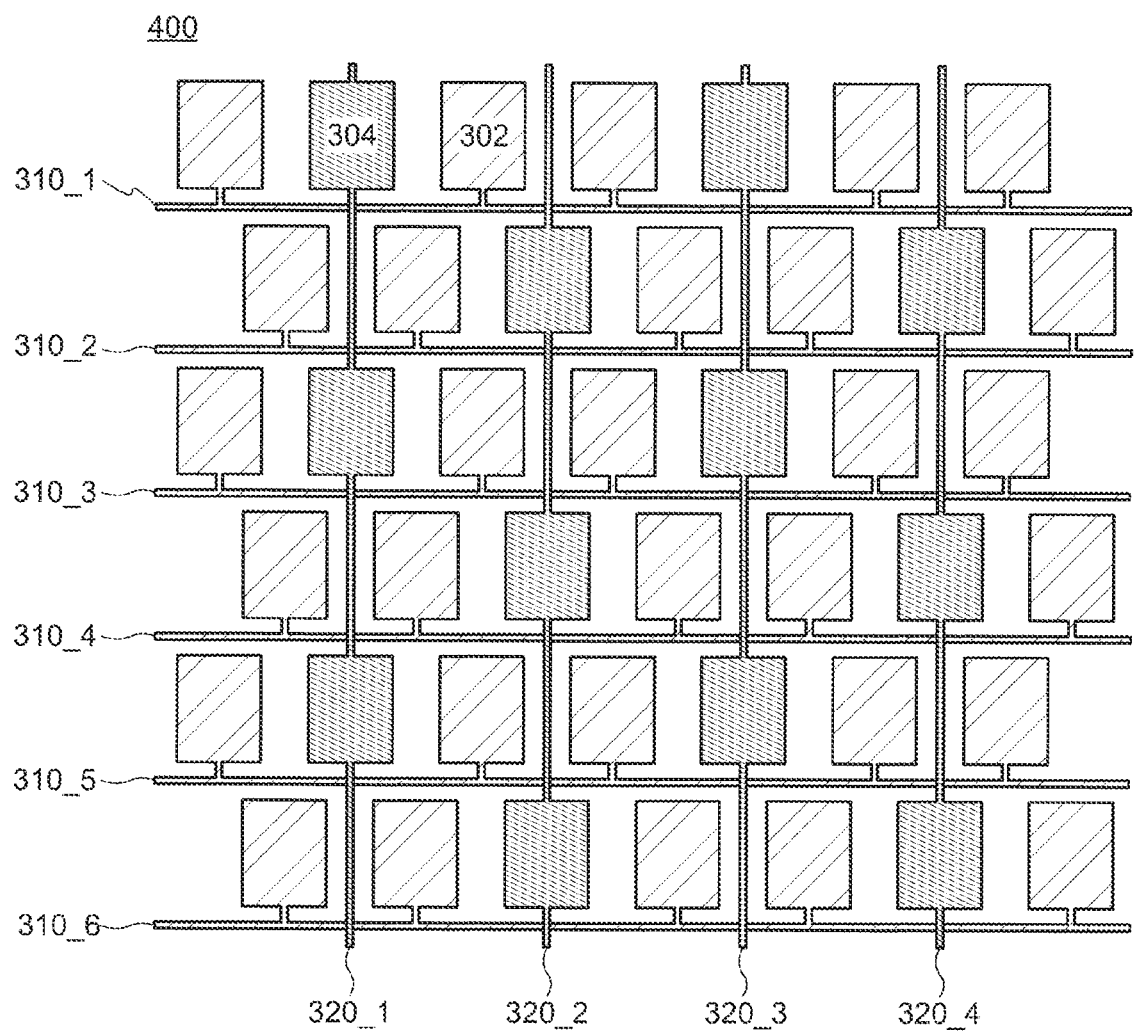
FIG. 22A and FIG. 22B are schematic top views of touch electrodes of a display device according to an embodiment of the present invention.
Figure 22B:
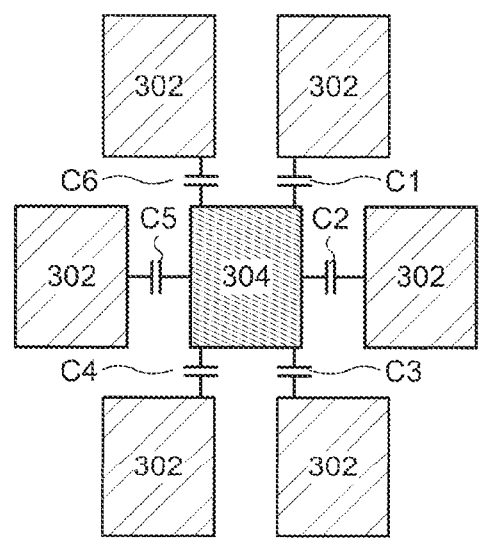

The touch sensor 400 shown in FIG. 22A is different from the touch sensors 360 and 370 in that the shape of the first electrodes 302 and the second electrodes 304 is a quadrangle. In the touch sensor 400, one second electrode 304 respectively forms capacitances C1 to C6 with the adjacent six first electrodes 302 as shown in FIG. 22B. Additionally, as can be understood from FIG. 22A, two of the six first electrodes 302 are connected to the kth first wiring (kth transmitting wiring, e.g., first wiring 310_1), two are connected to the (k+1)th first wiring ((k+1)th transmitting wiring, e.g., first wiring 310_2), and the other two are connected to the (k+2) first wiring ((k+2)th transmitting wiring, e.g., first wiring 310_3). Therefore, more accurate touch detection can be realized because it is possible to detect a touch as a variation of coupling signals with three different kinds of transmitting wirings.

Figure 23:
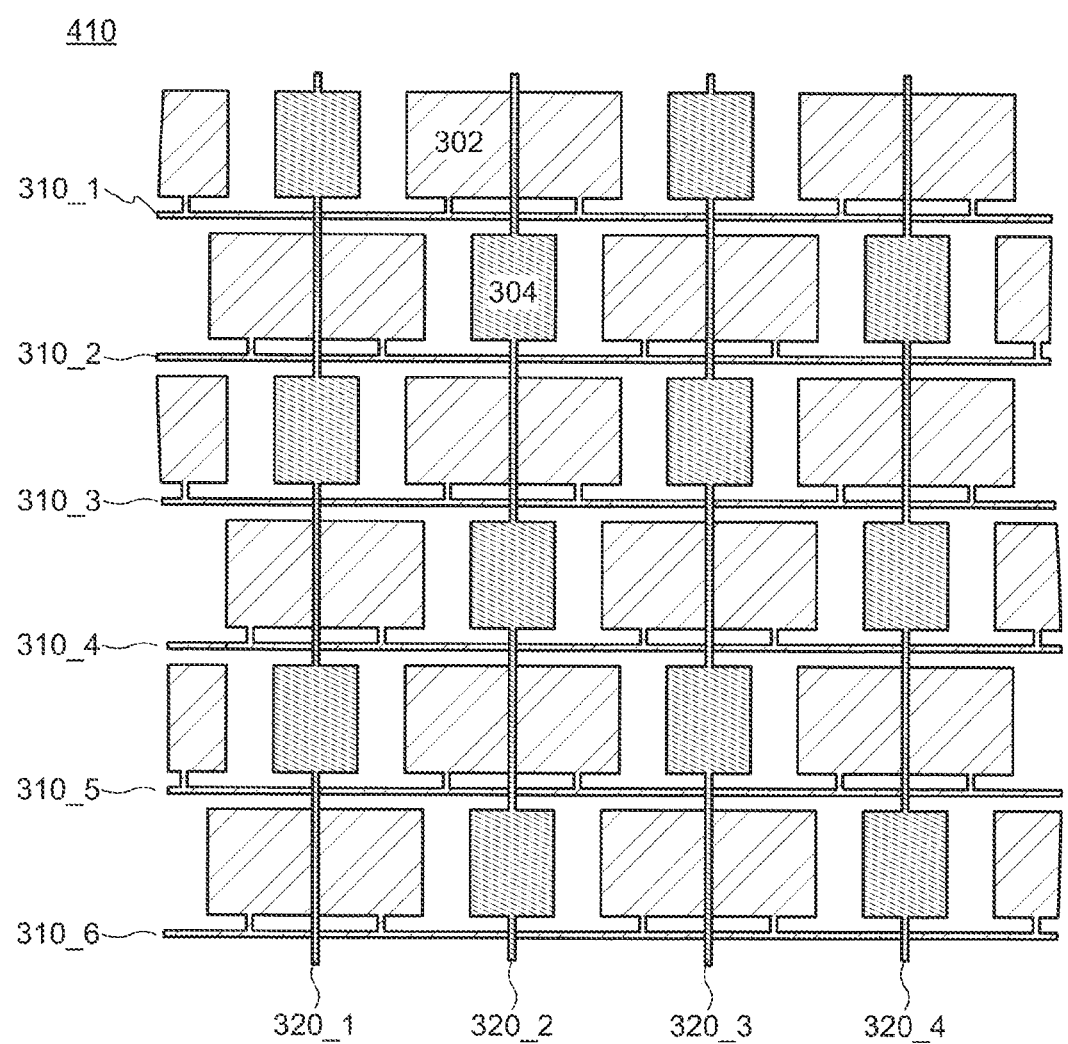
FIG. 23 is a schematic top view of touch electrodes of a display device according to an embodiment of the present invention.

The touch sensor of the present embodiment is not limited to the aforementioned structure and may be configured so that the shape or area of the first electrode 302 is different from that of the second electrode 304 as demonstrated by the touch sensor 410 shown in FIG. 23. In the touch sensor 410, the area of the first electrode 302 is larger than that of the second electrode 304. In this case, the second wiring 320 may overlap with the first electrode 302.

In such a structure, since the total length of the sides of the first electrode 302 opposed by the second electrode 304 is increased, larger capacitance is formed between the first electrodes 302 and the second electrodes 304, which enables touch detection with higher response rate and accuracy.

Figure 24A:
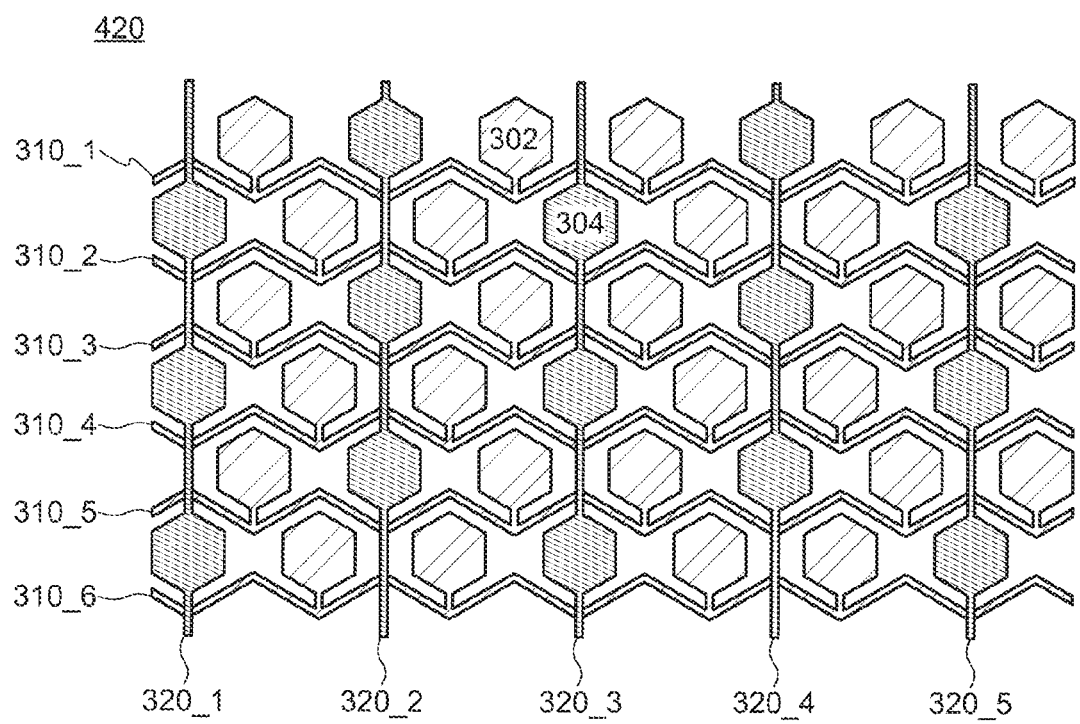
FIG. 24A and FIG. 24B are schematic top views of touch electrodes of a display device according to an embodiment of the present invention.
Figure 24B:
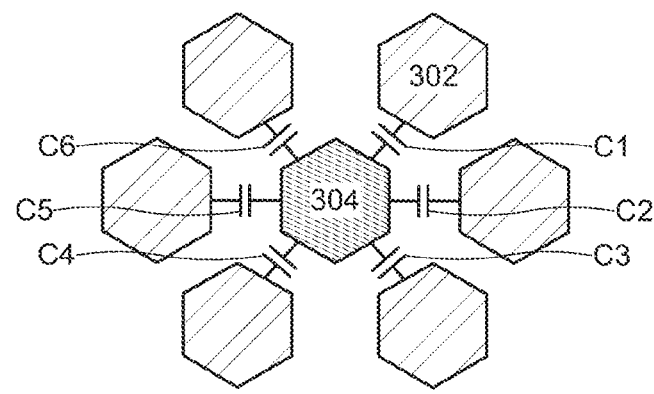

Additionally, in the touch sensor of the present embodiment, the first electrodes 302 and the second electrodes 304 each may be an octagon as demonstrated by the touch sensor 420 shown in FIG. 24A. In this case, one second electrode 304 respectively forms capacitances C1 to C6 with the adjacent six first electrodes 302 as shown in FIG. 24B. As can be understood from FIG. 24A, two of the six first electrodes 302 are connected to the kth first wiring (kth transmitting wiring, e.g., first wiring 310_1), two are connected to the (k+1)th first wiring ((k+1)th transmitting wiring, e.g., first wiring 310_2), and the other two are connected to the (k+2)th first wiring ((k+2)th transmitting wiring, e.g., first wiring 310_3). Therefore, more accurate touch detection can be realized because it is possible to detect a touch as a variation of coupling signals with three different kinds of transmitting wirings. In addition, since the shape of the first electrodes 302 and the second electrodes 304 is octagonal, the first electrodes 302 and the second electrodes 304 can be uniformly arranged, which enables reduction of variation in size of the capacitances C1 to C6. Hence, it is possible to suppress variation of the voltage change of the second wirings 320.

Figure 25:
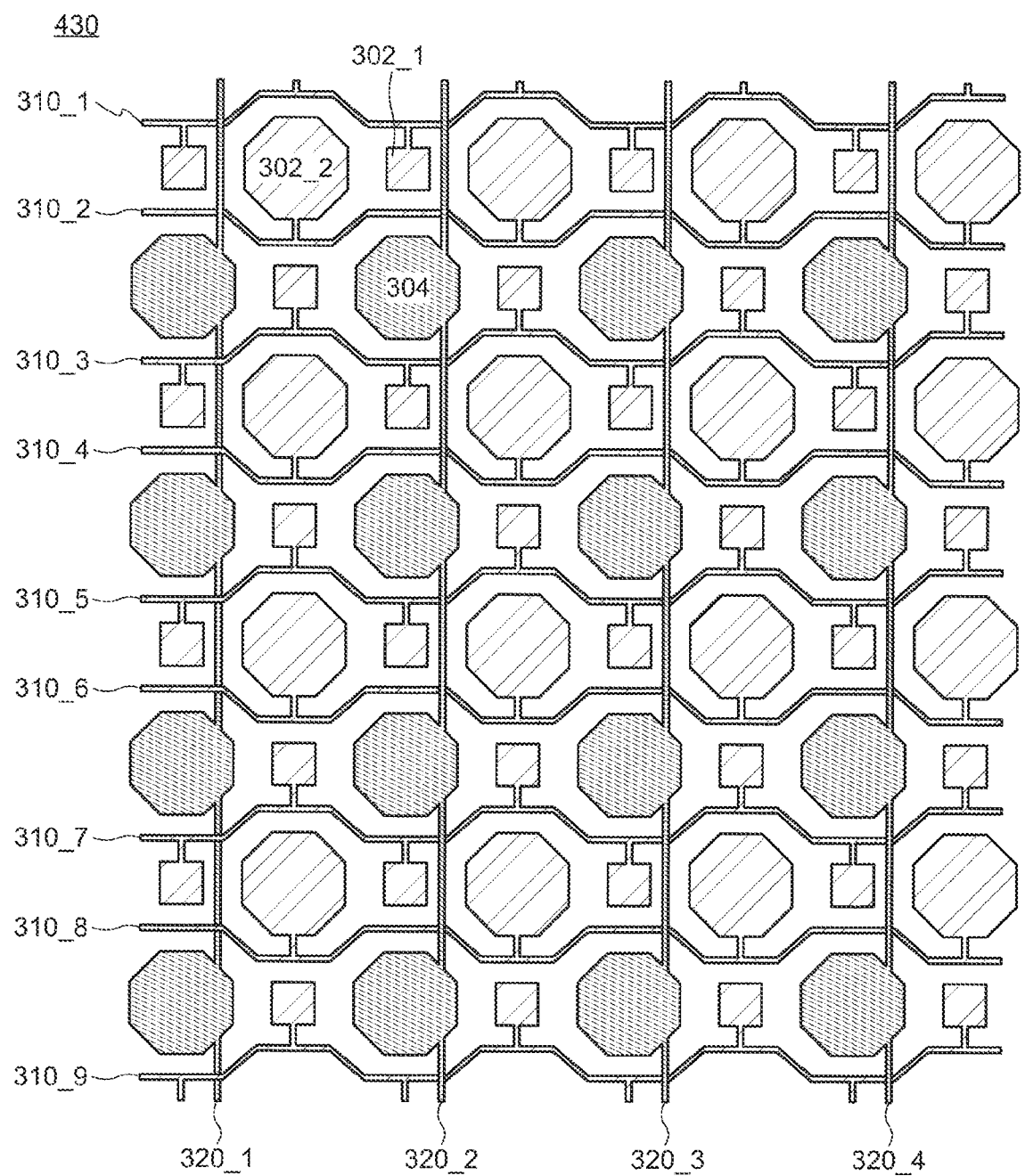
FIG. 25 is a schematic top view of touch electrodes of a display device according to an embodiment of the present invention.

Alternatively, the touch sensor of the present embodiment may be configured so that the shape and the area of the first electrode 302 and those of the second electrode 304 are different from each other as demonstrated by the touch sensor 430 shown in FIG. 25. Moreover, the first electrodes 302 with different shape and area may be connected to the first wiring 310. In the example shown in FIG. 25, the second electrodes 304 are octagonal. On the other hand, a part of the first wirings 310 is connected to the quadrangle first electrodes 302_1, and the other of the first wirings 310 is connected to the octagonal first electrodes 302_2. The first wirings 310 to which the quadrangle first electrodes 302_1 are connected may alternate with the first wirings 310 to which the octagonal first electrodes 302_2 are connected.

Figure 26:
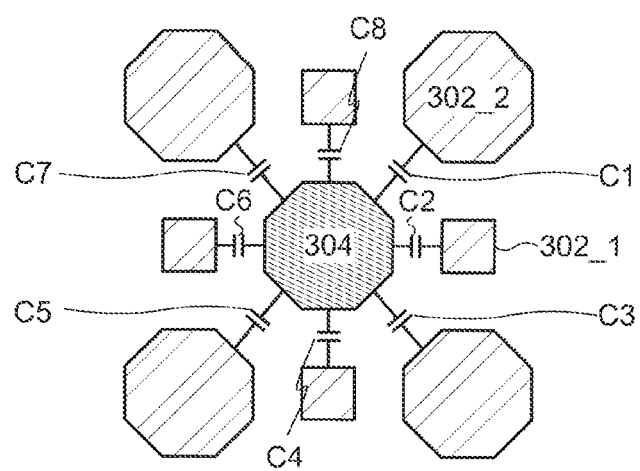
FIG. 26 is a schematic top view of touch electrodes of a display device according to an embodiment of the present invention.

In the touch sensor 430, one second electrode 304 forms capacitances C1 to C8 with the adjacent eight first electrodes 302 as shown in FIG. 26. Specifically, the second electrode 304 forms capacitances C2, C4, C6, and C8 with the four first electrodes 302_1 and four capacitances C1, C3, C5, and C7 with the first electrodes 302_2. Furthermore, as can be understood from FIG. 25, eight first electrodes 302 forming capacitances with one second electrode 304 are connected to four first wirings 310. Specifically, the second electrode 304 provided with a reference number in FIG. 25 forms capacitances with one first electrode 302_1 connected to the first wiring 310_1 (one transmitting electrode connected to the kth transmitting wiring), two first electrodes 302_2 connected to the first wiring 310_2 (two transmitting electrodes connected to the (k+1) transmitting wiring), three first electrodes 302_1 connected to the first wiring 310_3 (three transmitting electrodes connected to the (k+2)th transmitting wiring), and two first electrodes 302_2 connected to the first wiring 310_4 (two transmitting electrodes connected to the (k+3)th transmitting wiring). Hence, more accurate touch detection can be realized because it is possible to detect a touch as a variation of coupling signals with four different kinds of transmitting wirings.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although the cases of the organic EL display device are exemplified, the embodiments can be applied to any kind of display devices of the flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by persons ordinarily skilled in the art.

What is claimed is:

1. A display device comprising:
a plurality of pixels; and
a touch sensor overlapping with the plurality of pixels, the touch sensor comprising:
a first wiring arranged in a first direction and including a plurality of first electrodes; and
a second wiring arranged in a second direction intersecting the first direction and including a plurality of second electrodes,
wherein each of the first electrodes and each of the second electrodes vary in width continuously or stepwise in the first direction and the second direction, respectively, and satisfy the following equation:

$$0.042A \leq \frac{S}{A} < 0.063A$$

where S is an area of each of the first electrodes or each of the second electrodes, and A is a total length of sides of each of the first electrodes or each of the second electrodes,
the plurality of first electrodes is arranged linearly, and
the plurality of second electrodes is arranged in a zig-zag pattern.

2. The display device according to claim 1,
wherein the first wiring further comprises a connection portion connecting the adjacent first electrodes and having a constant width, and
the second wiring further comprises a connection portion connecting the adjacent second electrodes and having a constant width.

3. The display device according to claim 2,
wherein the connection portion of the second wiring is inclined from the second direction.

4. The display device according to claim 1,
wherein the first electrodes and the second electrodes each have a polygonal shape, and
each side of the polygonal shape is longer than one of the widths of the first wiring and the second wiring which is shorter than the other.

5. The display device according to claim 4,
wherein the polygonal shape is a triangle.

6. The display device according to claim 5,
wherein the polygonal shape is selected from an equilateral triangle, an isosceles triangle, and a right-angled triangle.

7. The display device according to claim 1,
wherein each of the first electrodes and each of the second electrodes have a mesh-shape with a plurality of openings.

8. The display device according to claim 7,
wherein each of the openings overlaps with three or more of the plurality of pixels.

9. The display device according to claim 7, further comprising a partition wall between the two adjacent pixels,
wherein, in each of the first electrodes and the second electrodes, a region between the two adjacent openings is confined within a region overlapping with the partition wall.

10. The display device according to claim 1, further comprising an insulating film between the first wiring and the second wiring.

11. The display device according to claim 1, further comprising an insulating film between the first to nth transmitting wirings and the first to mth receiving wirings.

12. A display device comprising:
a plurality of pixels each including a light-emitting element; and
a touch sensor overlapping with the plurality of pixels, the touch sensor comprising:
first to nth transmitting wirings arranged in a stripe form and each including a plurality of alternating transmitting electrodes and connection portions; and
first to mth receiving wirings arranged in a stripe form and each including a plurality of alternating receiving electrodes and connection portions,
wherein each of the plurality of transmitting electrodes and the plurality of receiving electrodes has a triangle shape,
m and n are each a natural number equal to or larger than 2, and
a direction of the triangle shape of the transmitting electrodes is opposite to a direction of the triangle shape of the receiving electrodes.

13. The display device according to claim 12,
wherein one of the plurality of receiving electrodes is surrounded by the two adjacent transmitting electrodes of the kth transmitting wiring and one of the transmitting electrodes of the (k+1)th transmitting wiring, and
k is a natural number equal to or larger than 1 and smaller than n.

14. The display device according to claim 12,
wherein one of the plurality of receiving electrodes is surrounded by the two adjacent transmitting electrodes of the kth transmitting wiring and the two adjacent transmitting electrodes of the (k+1)th transmitting wiring, and
k is a natural number equal to or larger than 1 and smaller than n.

15. The display device according to claim 14,
wherein three sides of the surrounded receiving electrode are parallel to a side of one of the two transmitting electrodes of the kth transmitting wiring, a side of the other of the two transmitting electrodes of the kth transmitting wiring, and a side of one of the two adjacent transmitting electrodes of the (k+1)th transmitting wiring, respectively.

16. The display device according to claim 12,
wherein each of the plurality of transmitting electrodes and each of the plurality of receiving electrodes are each a mesh-shape having a plurality of openings, and
each of the openings overlaps with three or more of the plurality of pixels.

17. The display device according to claim 16, further comprising a partition wall between the two adjacent pixels,
wherein, in each of the transmitting electrodes and the receiving electrodes, a region between the two adjacent openings is confined within a region overlapping with the partition wall.

* * * * *